(12) United States Patent
Honda et al.

(10) Patent No.: US 8,737,119 B2
(45) Date of Patent: May 27, 2014

(54) MAGNETIC MEMORY CELL AND MAGNETIC RANDOM ACCESS MEMORY

(75) Inventors: Takeshi Honda, Tokyo (JP); Noboru Sakimura, Tokyo (JP); Tadahiko Sugibayashi, Tokyo (JP); Hideaki Numata, Tokyo (JP); Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/433,895

(22) Filed: Mar. 29, 2012

(65) Prior Publication Data

US 2012/0206959 A1    Aug. 16, 2012

Related U.S. Application Data

(62) Division of application No. 12/443,349, filed as application No. PCT/JP2007/068522 on Sep. 25, 2007, now Pat. No. 8,477,528.

(30) Foreign Application Priority Data

Oct. 16, 2006    (JP) ................................. 2006-281189

(51) Int. Cl.
*G11C 11/16*    (2006.01)

(52) U.S. Cl.
USPC .......................................... 365/158; 365/171

(58) Field of Classification Search
CPC .... G11C 11/16; G11C 11/161; G11C 11/165; G11C 11/1653; G11C 11/1655; G11C 11/1657; G11C 11/1659; G11C 11/1673; G11C 11/1675; G11C 11/1677; G11C 11/1693; G11C 11/1695; G11C 11/1697
USPC ......................................... 365/158, 171, 173
See application file for complete search history.

(56) References Cited

U.S. PATENT DOCUMENTS

| | | | |
|---|---|---|---|
| 5,640,343 A | | 6/1997 | Gallagher et al. |
| 6,205,053 B1 * | | 3/2001 | Anthony ........................ 365/173 |

(Continued)

FOREIGN PATENT DOCUMENTS

| | | |
|---|---|---|
| JP | 2005505889 A | 2/2005 |
| JP | 2005093488 A | 4/2005 |

(Continued)

OTHER PUBLICATIONS

U.S Office Action for U.S. Appl. No. 12/443,349 mailed on Jul. 31, 2012.

(Continued)

*Primary Examiner* — Harry W Byrne
*Assistant Examiner* — Lance Reidlinger
(74) *Attorney, Agent, or Firm* — Sughrue Mion, PLLC

(57) ABSTRACT

A magnetic memory cell 1 is provided with a magnetic recording layer 10 which is a ferromagnetic layer and a pinned layer 30 connected with the magnetic recording layer 10 through a non-magnetic layer 20. The magnetic recording layer 10 has a magnetization inversion region 13, a first magnetization fixed region 11 and a second magnetization fixed region 12. The magnetization inversion region 13 has a magnetization whose orientation is invertible and overlaps the pinned layer 30. The first magnetization fixed region 11 is connected with a first boundary B1 in the magnetization inversion region 13 and a magnetization orientation is fixed on a first direction. The second magnetization fixed region 12 is connected with a second boundary B2 in magnetization inversion region 13 and a magnetization orientation is fixed on a second direction. The first direction and the second direction are opposite to each other.

20 Claims, 29 Drawing Sheets

(56) References Cited

U.S. PATENT DOCUMENTS

| | | |
|---|---|---|
| 6,545,906 B1 | 4/2003 | Savtchenko et al. |
| 6,765,823 B1 * | 7/2004 | Zhu et al. .................. 365/173 |
| 6,765,824 B2 * | 7/2004 | Kishi et al. ................ 365/173 |
| 6,834,005 B1 | 12/2004 | Parkin |
| 7,929,342 B2 | 4/2011 | Numata et al. |

FOREIGN PATENT DOCUMENTS

| | | |
|---|---|---|
| JP | 2005150303 A | 6/2005 |
| JP | 2005191032 A | 7/2005 |
| JP | 2006073930 A | 3/2006 |
| JP | 2007103663 A | 4/2007 |
| WO | 2007020823 A1 | 2/2007 |

OTHER PUBLICATIONS

International Search Report for PCT/JP2007/068522 mailed Nov. 13, 2007.

K. Yagami et al, "Research Trends in Spin Transfer Magnetization Switching", Japanese Applied Magnetic Academic Society Journal, vol. 28, No. 9, 2004, p. 937-948.

A. Yamaguchi et al., "Real-Space Observation of Current-Driven Domain Wall Motion in Submicron Magnetic Wires", Physical Review Letters, vol. 92, No. 7, Feb. 20, 2004, p. 077205-1-077205-4.

* cited by examiner

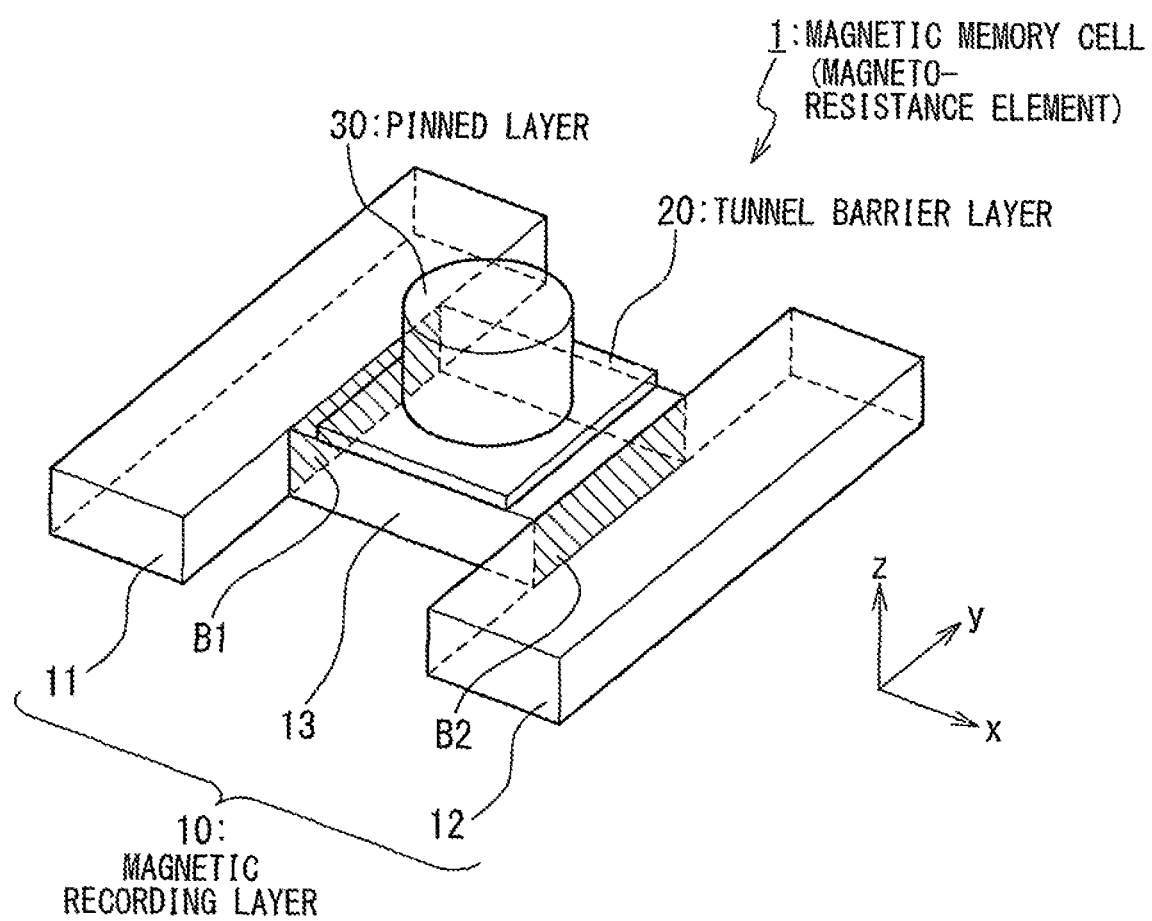

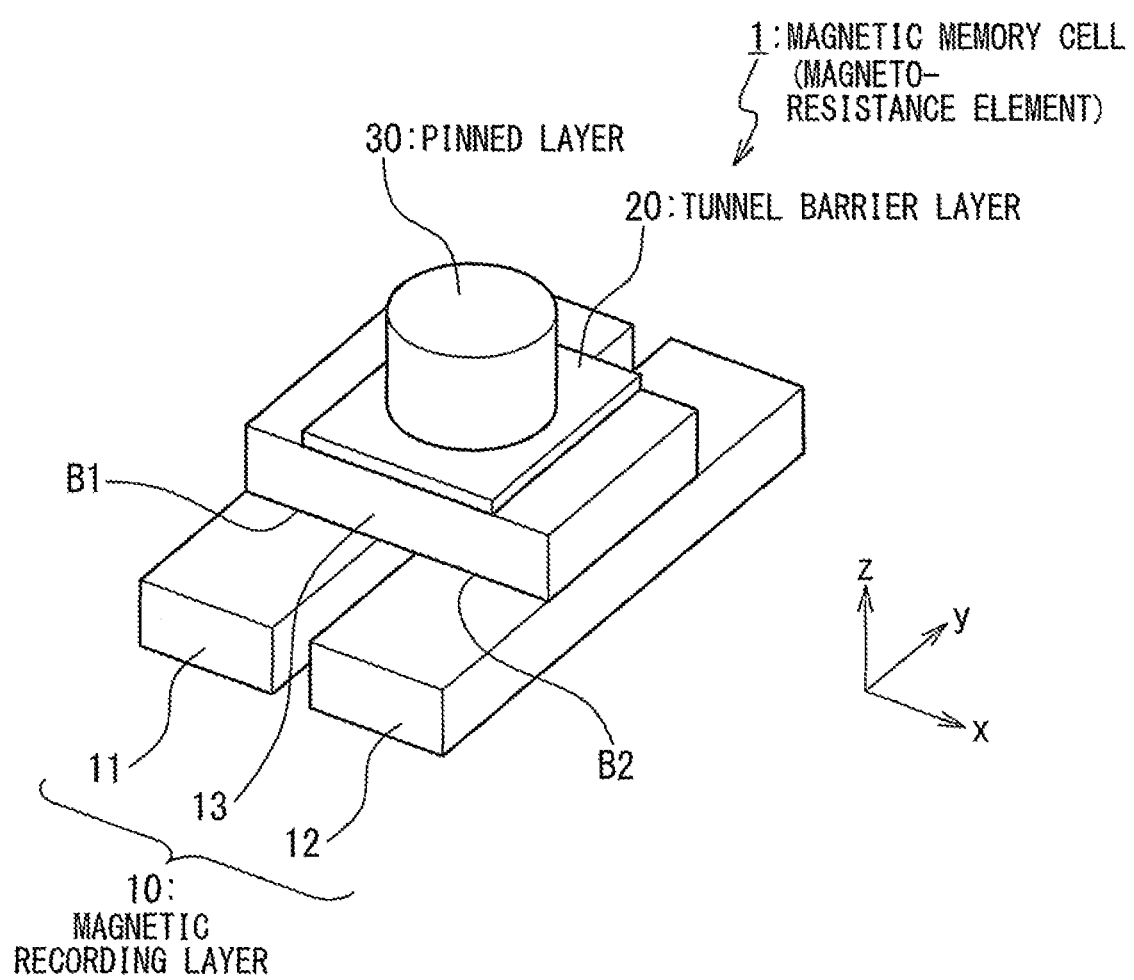

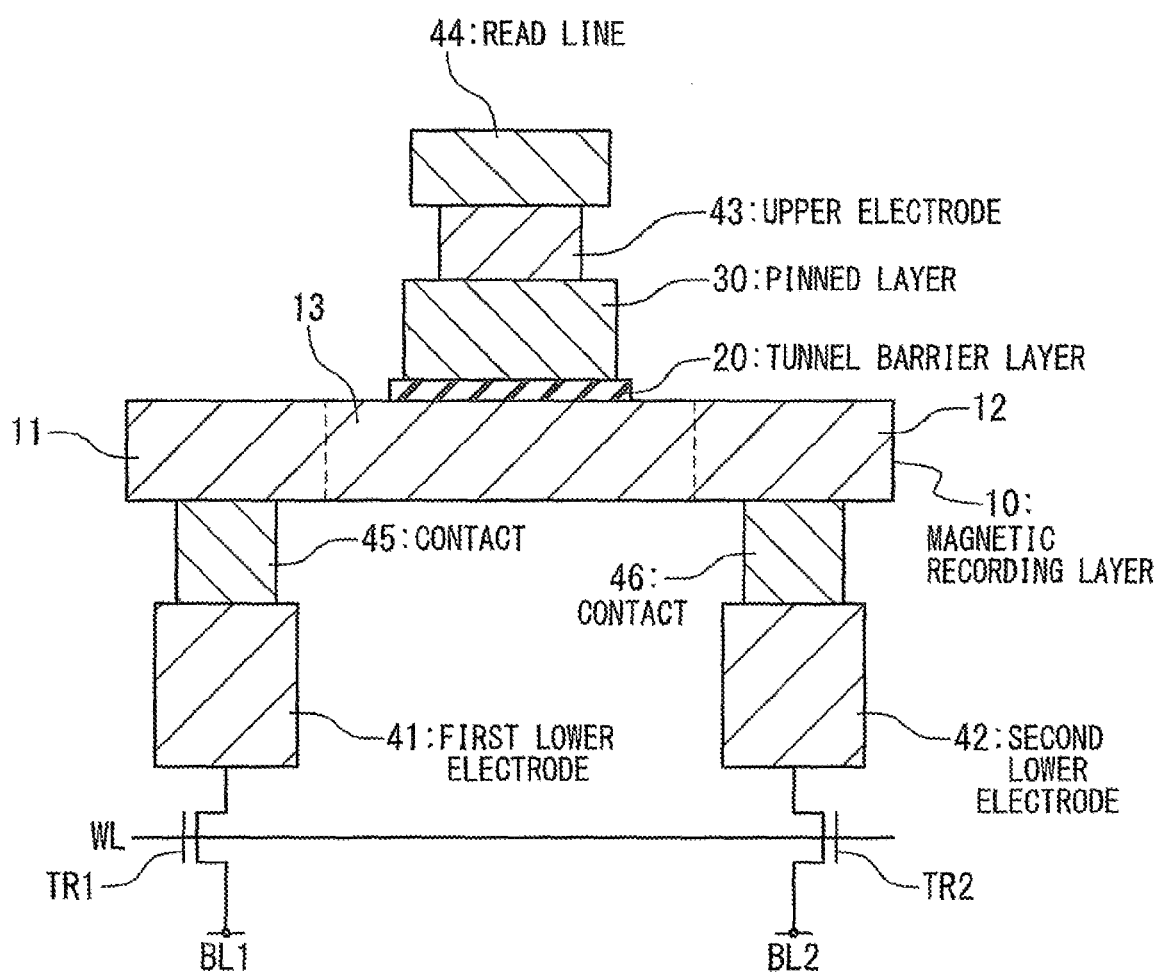

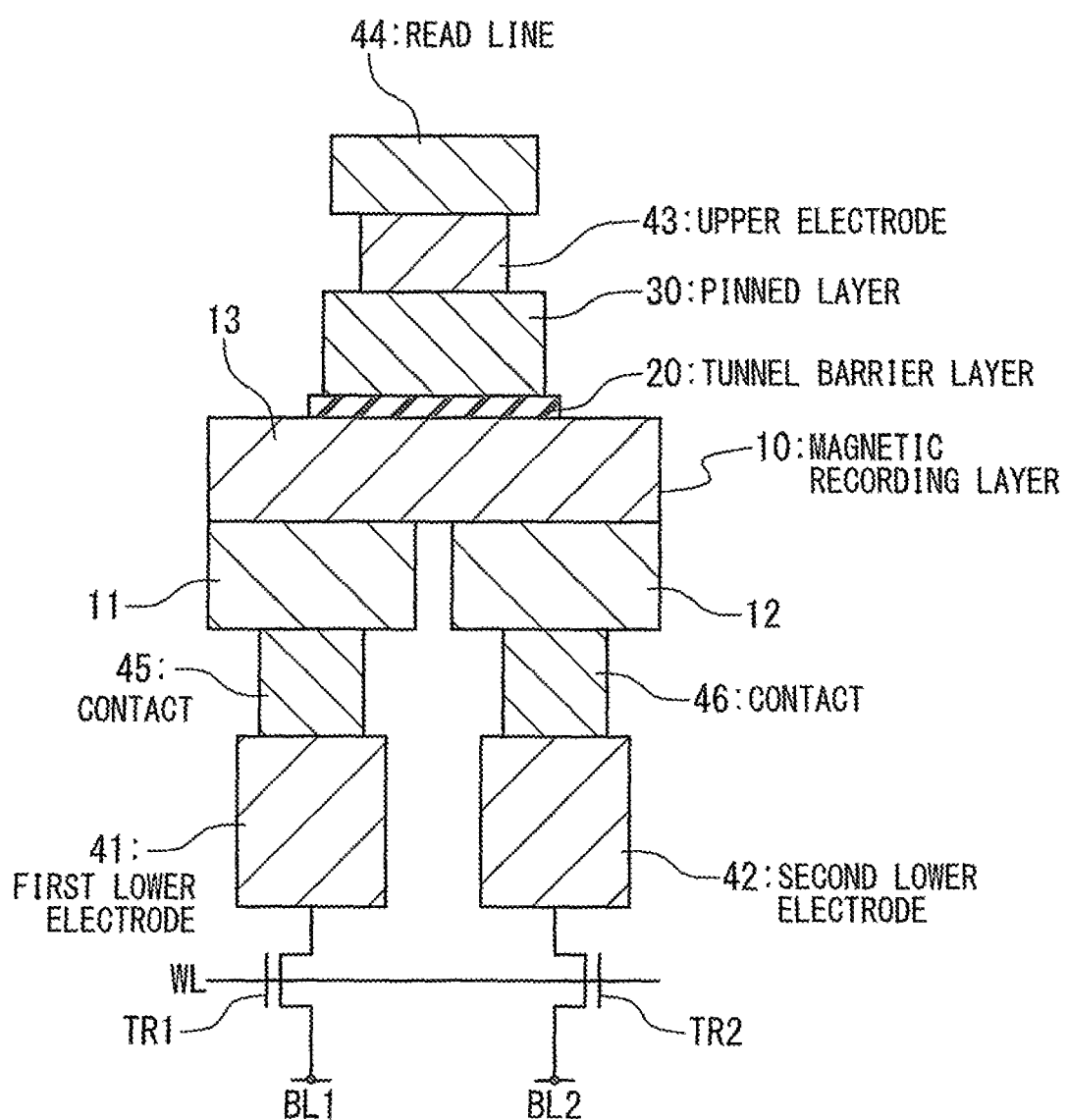

Fig. 10A

| WRITE "1" | · WORD LINE WL=H<br>· BIT LINE BL1=H<br>· BIT LINE BL2=L |
|---|---|
| WRITE "0" | · WORD LINE WL=H<br>· BIT LINE BL1=L<br>· BIT LINE BL2=H |
| READ | · WORD LINE WL=H<br>$\{$ · BIT LINE BL1=H<br>· BIT LINE BL2=open<br>OR<br>$\{$ · BIT LINE BL1=open<br>· BIT LINE BL2=H |

Fig. 10B

| WRITE "0" | · WORD LINE WL=H<br>· BIT LINE BL1=H<br>· BIT LINE BL2=L |
|---|---|
| WRITE "1" | · WORD LINE WL=H<br>· BIT LINE BL1=L<br>· BIT LINE BL2=H |
| READ | · WORD LINE WL=H<br>{ · BIT LINE BL1=H<br>{ · BIT LINE BL2=open<br>OR<br>{ · BIT LINE BL1=open<br>{ · BIT LINE BL2=H |

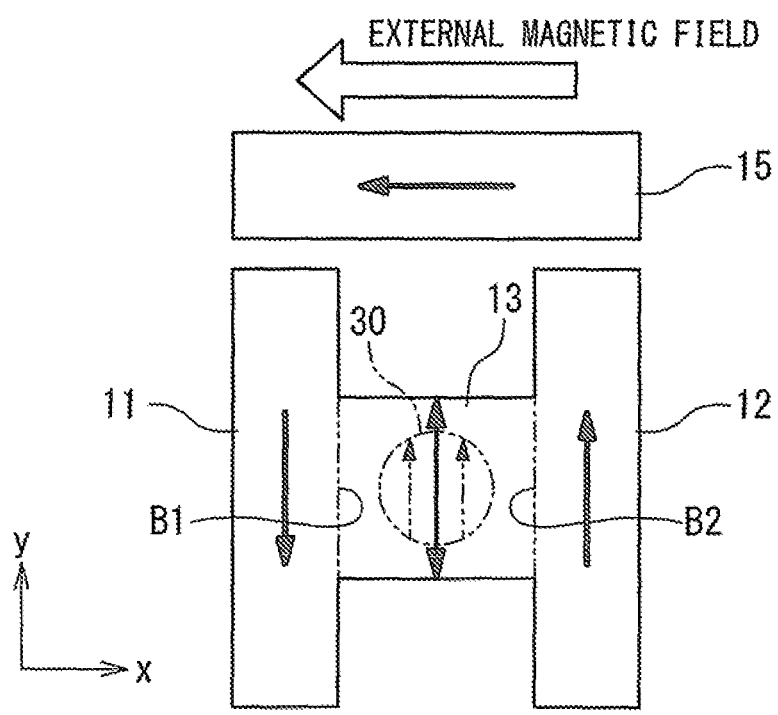

MAGNETIC MEMORY CELL AND MAGNETIC RANDOM ACCESS MEMORY

REFERENCE TO RELATED APPLICATION

This is a divisional application of U.S. patent application Ser. No. 12/443,349 filed Mar. 27, 2009 and claims the benefit of its priority.

TECHNICAL FIELD

The present invention relates to a magnetic random access memory in which magnetic memory cells are integrated, and a read/write method of a data from/to the magnetic random access memory.

BACKGROUND ART

A magnetic random access memory (MRAM) is a nonvolatile memory that is hopeful from the viewpoints of a high integration and a high speed operation. As a method of writing, data to the MRAM, conventionally, an "Asteroid method" (for example, U.S. Pat. No. 5,640,343) and a "Toggle method" (for example, U.S. Pat. No. 6,545,906, Japanese Patent Application Publication JP-P2005-505889A) are known. According to these write methods, a switching magnetic field required to switch magnetization of a free layer becomes greater in substantially inversely proportional to a memory cell size. In short, there is known a tendency that a write current increases as the memory cell is made smaller.

As the write method that can suppress the increase of a write current in association with a fine structure, there are proposed a "Spin Transfer Method" (for example, Japanese Patent Application Publication (JP-P2005-093488A), and "Research Trends in Spin Transfer Magnetization Switching" (Japanese Applied Magnetic Academic Society Journal, Vol. 28, No. 9, 2004) by K. Yagami and Y. Suzuki. According to the spin transfer method, a spin-polarized current is injected to a ferromagnetic conductor, and the magnetization is switched by the directly interaction between a spin of a conductive electron as a carrier and magnetic moment of the conductor (hereinafter, to be referred to as a spin transfer magnetization switching). The outline of the spin transfer magnetization switching will be described below with reference to FIG. 1.

In FIG. 1, a magneto-resistance element contains a free layer 101, a pinned layer 103, and a tunnel barrier layer 102, which is a non-magnetic layer and put between the free layer 101 and the pinned layer 103. Here, the pinned layer 103 whose magnetization orientation is fixed is formed to be thicker than the free layer 101 and functions as a mechanism (spin filter) for generating the spin-polarized current. A state in which the magnetization orientations of the free layer 101 and the pinned layer 103 are parallel is correlated to a data "0", and a state in which they are anti-parallel is correlated to a data "1".

The spin transfer magnetization switching shown in FIG. 1 is attained by a CPP (Current Perpendicular to Plane) method, and a write current is vertically injected to a film surface. Specifically at a time of a transition from the data "0" to the data "1", a current flows from the pinned layer 103 to the free layer 101. In this case, electrons having the same spin state as the pinned layer 103 serving as a spin filter move from the free layer 101 to the pinned layer 103. Thus, the magnetization of the free layer 101 is switched through a spin transfer effect (exchange of a spin angular motion amount). On the other hand, at a time of transition from the data "1" to the data "0", the current flows from the free layer 101 to the pinned layer 103. In this case, electrons having the same spin state as the pinned layer 103 serving as the spin filter move from the pinned layer 103 to the free layer 101. The magnetization of the free layer 101 is switched through the spin transfer effect.

In this way, in the spin transfer magnetization switching, the write of data is carried out through the movement of the spin electrons. The magnetization orientation of the free layer 101 can be defined in accordance with a direction of spin-polarized current that is vertically injected to the film surface. Here, a threshold at the time of write (magnetization switching) is known to depend on a current density. Thus, as a memory cell size is contracted, the write current necessary for the magnetization switching decreases. In association with the finer structure of the memory cell, the write current decreases. Thus, the spin transfer magnetization switching is important in attaining the larger capacity of the MRAM.

As a related art, U.S. Pat. No. 6,834,005 discloses a magnetic shift register that uses the spin transfer. This magnetic shift register stores a data by using a domain wall inside a magnetic substance body. In the magnetic substance body with many regions (magnetic domains), the current is injected to pass through the domain wall, and the domain wall is moved by the current. The magnetization orientation in each domain is used as a record data. Such a magnetic shift register is used to record, for example, a large quantity of serial data. It should be noted that the motion of the domain wall inside the magnetic substance body is also reported in "Real-Space Observation of Current-Driven Domain Wall Motion in Sub-micron Magnetic Wires" (PRL, Vol. 92, pp. 077205-1-0077205-4, 2004) by A. Yamaguchi, et al.

As a related art, Japanese Patent Application Publication (JP-P2006-73930A) discloses a method of changing a magnetization state of a magneto-resistance effect element by using the domain wall motion, and a magnetic memory element and a solid magnetic memory using the method. This magnetic memory element has a first magnetic layer, a middle layer and a second magnetic layer, and records data as the magnetization orientations of the first magnetic layer and the second magnetic layer. In this magnetic memory element, the magnetic domains that are magnetized anti-parallel to each other and the domain wall that separates those magnetic domains are steadily formed inside at least one magnetic layer, and the domain wall is moved inside the magnetic layer. As a result, the positions of the magnetic domains adjacent to each other are controlled for data recording.

As a related art, Japanese Patent Application Publication (JP-P2005-191032A) discloses a magnetic memory device and a method of writing a data. This magnetic memory device includes a conductive magnetization fixed layer to which a fixed magnetization is given, a tunnel insulating layer formed on the magnetization fixed layer, a conductive magnetization free layer that has a junction section formed on the magnetization fixed layer through the tunnel insulating layer, domain wall pinned sections formed adjacently to a pair of ends of the junction section, and a pair of magnetization fixed sections which are adjacent to the domain wall pinned sections and to which the fixed magnetizations of orientations opposite to each other are given, and a pair of magnetic data write terminals that are electrically connected to a pair of magnetization fixed sections, and are provided to flow to the magnetization free layer, a current which penetrates through the junction section of the magnetization free layer, a pair of domain wall pinned sections and a pair of the magnetization fixed sections.

As a related art, Japanese Patent Application Publication (JP-P2005-150303A) discloses a magneto-resistance effect element and a magnetic memory device. This magneto-resistance effect element has a ferromagnetic tunnel junction that has a 3-layer structure of a first ferromagnetic layer/a tunnel barrier layer/a second ferromagnetic layer. The first ferromagnetic layer is greater in coercive force than the second ferromagnetic layer. A tunnel conductance is changed in accordance with the relative angle of the magnetizations between the two ferromagnetic layers. This magneto-resistance effect element is characterized in that the magnetization of the end of the second ferromagnetic layer is fixed to a direction having a component orthogonal to a magnetization easiness axis direction of the second ferromagnetic layer.

DISCLOSURE OF INVENTION

An object of the present invention is to provide a new data write method with regard to the MRAM.

Another object of the present invention is to provide an MRAM that can suppress the deterioration of a tunnel barrier layer in an MTJ, and a data write method.

Still another object of the present invention is to provide an MRAM that can decrease a write current in association with contraction of a memory cell size, and a data write method.

Still another object of the present invention is to provide an MRAM that can increase a write speed in association with contraction of a memory size, and a data write method.

Those objects of this invention and the objects other than them can be easily verified from the following descriptions and the attached drawings.

A magnetic memory cell of the present invention contains a magnetic recording layer that is a ferromagnetic layer, and a pinned layer connected to the magnetic recording layer through a non-magnetic layer. The magnetic recording layer has a magnetization inversion region, a first magnetization fixed region and a second magnetization fixed region. The magnetization inversion region has a magnetization whose orientation can be switched in a first direction or a second direction and overlaps with the pinned layer. The first magnetization fixed region is connected to a first boundary of the magnetization inversion region, and its magnetization orientation is fixed to the first direction. The second magnetization fixed region is connected to a second boundary of the magnetization inversion region, and its magnetization orientation is fixed to a second direction. The first direction and the second direction are opposite to each other.

A magnetic memory cell of the present invention has a magneto-resistance element, a first magnetization fixed section and a second magnetization fixed section. The magneto-resistance element has a free layer, a pinned layer, and a non-magnetic layer sandwiched between the free layer and the pinned layer. The first magnetization fixed section is connected to the free layer on a first boundary, and its magnetization orientation is fixed to a first direction. The second magnetization fixed section is connected to the free layer on a second boundary, and its magnetization orientation is fixed to a second direction. The first direction and the second direction are opposite to each other, namely, a direction towards the free layer or a direction from the free layer. The current, which flows between the first magnetization fixed section and the second magnetization fixed section, causes a domain wall to be moved between the first boundary and the second boundary in the free layer.

A magnetic random access memory of the present invention contains the foregoing magnetic memory cell, a word line connected to the magnetic memory cell, and a bit line connected to the magnetic memory cell.

An operation method of a magnetic random access memory of the present invention is provided. The magnetic random access memory has a magnetic memory cell. The magnetic memory cell contains a magnetic recording layer that is the ferromagnetic layer; and a pinned layer connected to the magnetic recording layer through a non-magnetic layer. The magnetic recording layer has a magnetization inversion region that has a magnetization invertible in a first direction or second direction and overlaps the pinned layer, a first magnetization fixed region connected to a first boundary of the magnetization inversion region and whose magnetization orientation is fixed to the first direction, and a second magnetization fixed region connected to a second boundary of the magnetization inversion region and whose magnetization orientation is fixed to the second direction. The first direction is parallel or anti-parallel to the magnetization orientation of the pinned layer. The operation method of the magnetic random access memory includes (A) making a first write current flow from the first magnetization fixed region through the magnetization inversion region to the second magnetization fixed region, when a first data is written; and (B) making a second write current flow from the second magnetization fixed region through the magnetization inversion region to the first magnetization fixed region, when a second data is written.

An operation method of a magnetic random access memory of the present invention is provided. The magnetic random access memory has a magnetic memory cell. The magnetic memory cell contains a magnetic recording layer that is a ferromagnetic layer, and a pinned layer connected to the magnetic recording layer through a non-magnetic layer. The magnetic recording layer has a magnetization inversion region which overlaps the pinned layer and in which the domain wall is moved; a first magnetization fixed region connected to a first boundary of the magnetization inversion region and whose magnetization orientation is fixed to a first direction; and a second magnetization fixed region connected to a second boundary of the magnetization inversion region and whose magnetization orientation is fixed to a second direction. The first direction is parallel or anti-parallel to the magnetization orientation of the pinned layer. The operation method of the magnetic random access memory includes (A) making a first write current flow from the first magnetization fixed region to the second magnetization fixed region to move the domain wall inside the magnetic recording layer to the first boundary, when the first data is written; and (B) making a second write current flow from the second magnetization fixed region to the first magnetization fixed region to move the domain wall to the second boundary, when the second data is written.

BRIEF DESCRIPTION OF DRAWINGS

FIG. 2 is a diagram showing one example of a structure of a magnetic memory cell according to a first exemplary embodiment of the present invention;

FIG. 3 is a diagram showing another example of the structure of the magnetic memory cell according to the first exemplary embodiment of the present invention;

FIG. 9A is a sectional view schematically showing the circuit configuration of the magnetic memory cell according to the first exemplary embodiment and corresponding to FIG. 2;

FIG. 9B is a section view schematically showing the circuit configuration of the magnetic memory cell according to the first exemplary embodiment and corresponding to FIG. 3;

FIG. 10A is a table summarily showing a data reading/writing method according to the first exemplary embodiment and corresponding to FIG. 4A, FIG. 4B and FIG. 5;

FIG. 10B is a table summarily showing a data reading/writing method according to the first exemplary embodiment and corresponding to FIG. 6A, FIG. 6B and FIG. 7;

FIG. 17 is a side view showing still another example of a method of fixing a magnetization orientation in the magnetization fixing region;

BEST MODE FOR CARRYING OUT THE INVENTION

Figure 1:
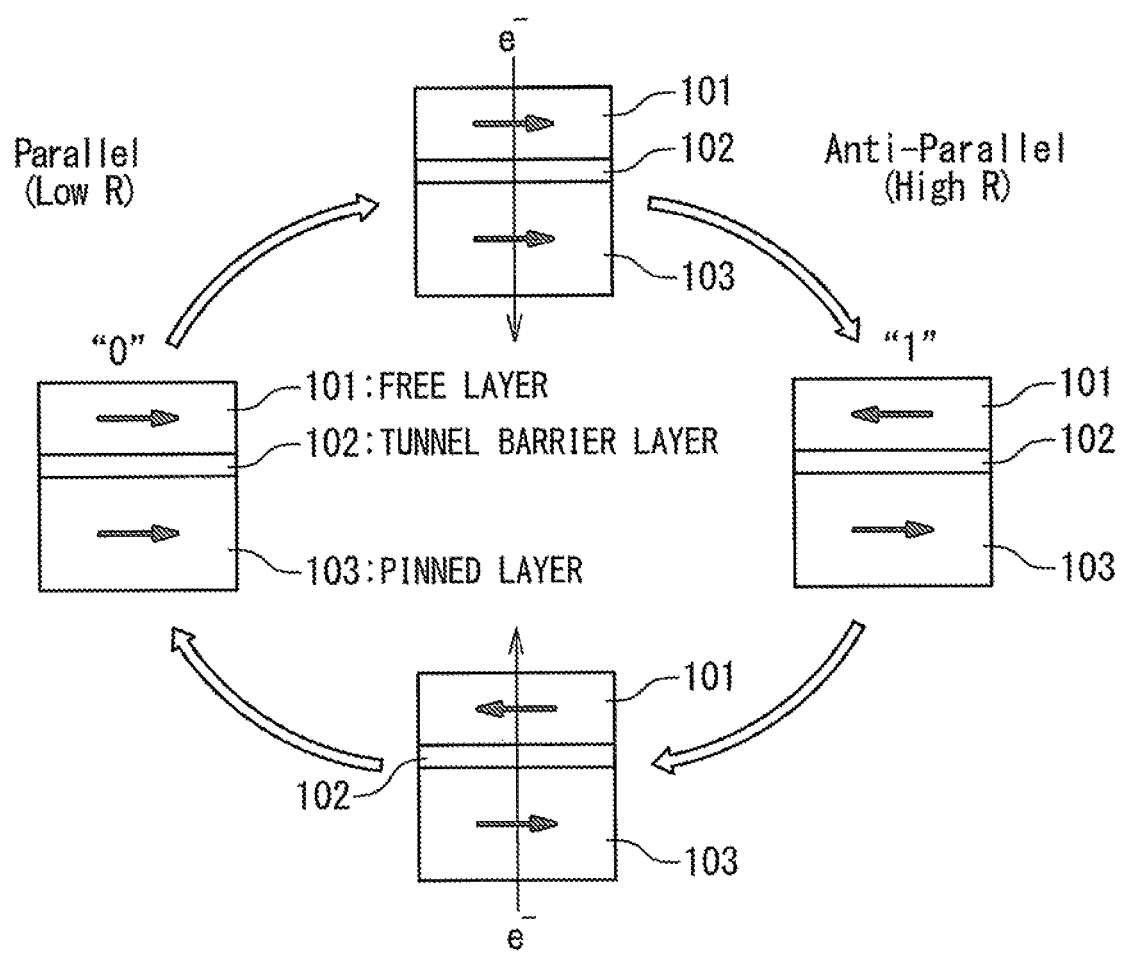
FIG. 1 is a diagram showing data write based on a conventional spin transfer method.

A magnetic memory cell, a magnetic random access memory, and a data writing method of the magnetic random access memory according to the present invention will be described below with reference to the attached drawings.

1. FIRST EXEMPLARY EMBODIMENT 1-1. Structure of Magnetic Memory Cell and Write Principle FIG. 2 is a perspective view showing an example of the configuration of a magnetic memory cell 1 (magneto-resistance element) according to the first exemplary embodiment of the present invention. The magnetic memory cell 1 contains a magnetic recording layer 10 and a pinned layer 30, which are ferromagnetic layers, and a tunnel barrier layer 20 which is a non-magnetic layer. The tunnel barrier layer 20 is put between the magnetic recording layer 10 and the pinned layer 30. The magnetic recording layer 10, the tunnel barrier layer 20 and the pinned layer 30 form a magnetic tunnel junction (MTJ).

The tunnel barrier layer 20 is a thin insulating layer and formed by oxidizing an Al film, for example. The pinned layer 30 is a lamination film of, for example, CoFe/Ru/CoFe/PtMn, and its magnetization orientation is fixed. The magnetic recording layer 10 is made of, for example, CoFe and functions equivalent to a free layer.

As shown in FIG. 2, the magnetic recording layer 10 according to this exemplary embodiment has three different regions, i.e., a first magnetization fixed region 11, a second magnetization fixed region 12 and a magnetization inversion region 13. The first magnetization fixed region 11 is formed to extend in a Y-direction, and its magnetization orientation is fixed. Similarly, the second magnetization fixed region 12 is formed to extend in the Y-direction, and its magnetization orientation is opposite to the magnetization orientation in the first magnetization fixed region 11. On the other hand, the magnetization inversion region 13 is formed to extend in an X-direction and has an invertible magnetization. The magnetization orientation of the magnetization inversion region 13 is equal to that of one of the first magnetization fixed region 11 and the second magnetization fixed region 12. Also, this magnetization inversion region 13 is formed to overlap the pinned layer 30. In other words, a part of the magnetization inversion region 13 in the magnetic recording layer 10 is connected through the tunnel barrier layer 20 to the pinned layer 30.

Figure 4A:
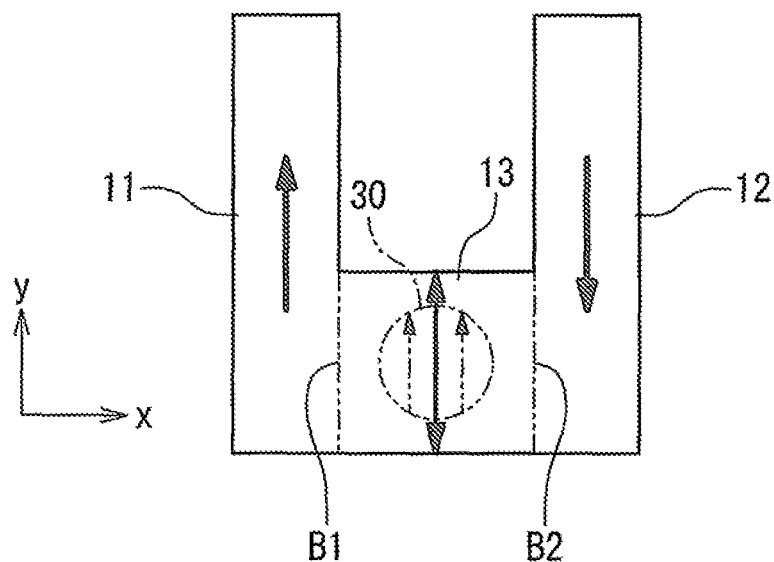
FIG. 4A is a plan view showing one example of the structure of the magnetic memory cell shown in FIG. 2.
Figure 4B:
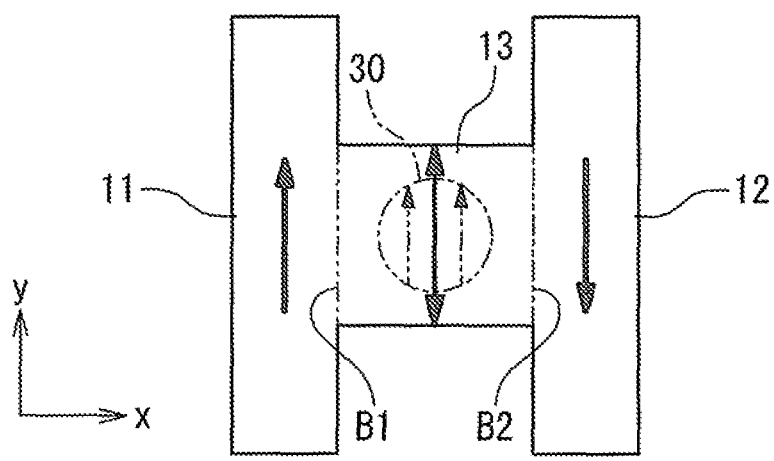
FIG. 4B is a plan view showing another example of the structure of the magnetic memory cell shown in FIG. 2.

The first magnetization fixed region 11, the second magnetization fixed region 12 and the magnetization inversion region 13 are formed on the same flat surface (XY plane) in case of FIG. 2. FIG. 4A and FIG. 4B are schematic diagrams showing examples of the shapes and magnetization orientations of the magnetic recording layer 10 on the XY plane. In this exemplary embodiment, the first magnetization fixed region 11 and the second magnetization fixed region 12 are formed to be approximately parallel to each other along the Y-direction. The magnetization inversion region 13 is formed along the X-direction for linkage between the first magnetization fixed region 11 and the second magnetization fixed region 12. The first magnetization fixed region 11 and the magnetization inversion region 13 are in contact with each other in a first boundary B1. The second magnetization fixed region 12 and the magnetization inversion region 13 are connected to each other in a second boundary B2. In the magnetization inversion region 13, the first boundary B1 and the second boundary B2 are located to oppose to each other. In other words, the first and second magnetization fixed regions 11 and 12 and the magnetization inversion region 13 are formed to have a "concave-shaped (angular U-shaped)" form (FIG. 4A) or an "H-shaped" form (FIG. 4B).

In FIG. 4A and FIG. 4B, the magnetization orientations of the respective regions are also indicated by arrow marks. Moreover, a projection of the pinned layer 30 and its magnetization orientation are also indicated by dotted lines and dotted line arrow marks. It is supposed that the magnetization orientation of the pinned layer 30 is fixed to the +Y-direction, and the magnetization orientation of the first magnetization fixed region 11 is fixed to the +Y-direction. In this case, the magnetization orientation of the second magnetization fixed region 12 is fixed to the −Y-direction. In short, the first magnetization fixed region 11 and the second magnetization fixed region 12 are formed such that their magnetization orientations are opposite to each other. It should be noted that "Fixation of Magnetization" will be described later (Paragraph 1-3).

On the other hand, the magnetization orientation of the magnetization inversion region 13 can be switched, and it is the +Y-direction or the −Y-direction. In short, the magnetization of the magnetization inversion region 13 is allowed to be parallel or anti-parallel to the magnetization of the pinned layer 30. This is attained by setting crystalline magnetic anisotropy for the ±Y-direction of the magnetization inversion region 13. For example, when the magnetization orientation of the magnetization inversion region 13 is the −Y-direction, namely, when the magnetization is equal to the second magnetization fixed region 12, the first magnetization fixed region 11 forms one magnetic domain, and the magnetization inversion region 13 and the second magnetization fixed region 12 forms a different magnetic domain. In short, a "Domain Wall" is formed on the first boundary B1. On the other hand, when the magnetization orientation of the magnetization inversion region 13 is the +Y-direction, namely, when the magnetization is equal to the first magnetization fixed region 11, the first magnetization fixed region 11 and the magnetization inversion region 13 forms one magnetic domain, and the second magnetization fixed region 12 forms a different magnetic domain. In short, the domain wall is formed on the second boundary B2.

In this way, the magnetization of the magnetization inversion region 13 is oriented to the first direction (e.g., −Y-direction) or the second direction (e.g., +Y-direction). In the magnetic recording layer 10, the domain wall is formed on the first boundary B1 or the second boundary 82. This is because the magnetization orientation of the first magnetization fixed region 11 and the magnetization orientation of the second magnetization fixed region 12 are opposite.

It should be noted that FIG. 3 is a perspective view showing another example of the configuration of the magnetic memory cell 1 according to the first exemplary embodiment of the present invention. In this example of the magnetic memory cell 1, the first magnetization fixed region 11 and the second magnetization fixed region 12 are formed on the same flat surface (XY plane), and the magnetization inversion region 13 is put on them. However, the magnetic arrangements are similar to those shown in FIG. 4A and FIG. 4B, and the descriptions are omitted.

The principle of writing a data into the magnetic memory cell 1 will be described below. According to this exemplary embodiment, the write of the data is carried out by the spin transfer method (Spin Transfer Data Writing).

STRUCTURE EXAMPLE 1

Figure 5:
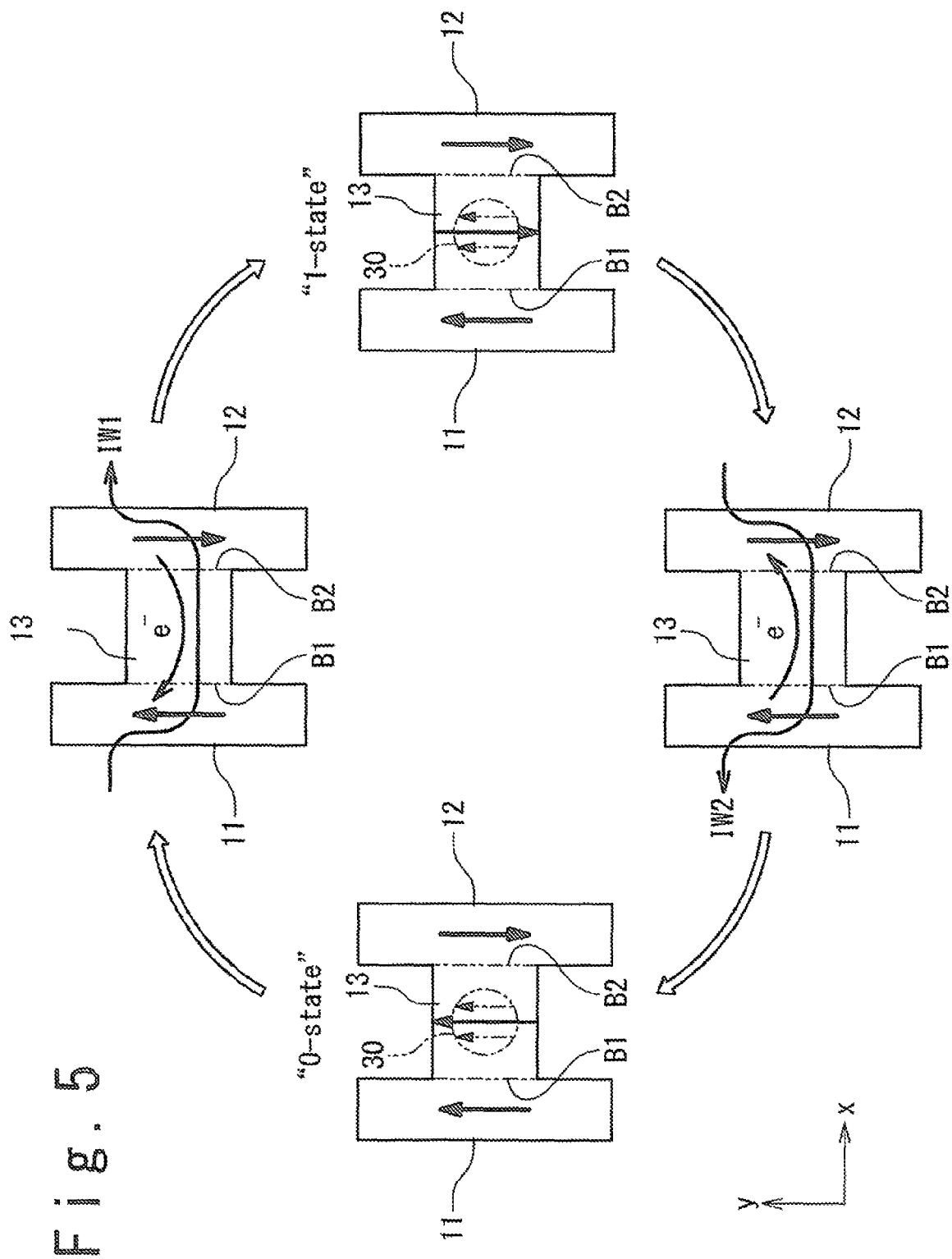
FIG. 5 is a plan view showing the principle of the data write to the magnetic memory cells shown in FIG. 4A and FIG. 4B.

FIG. 5 is a diagram schematically showing the principle of writing a data into the magnetic memory cell 1 having the structure shown in FIG. 2, FIG. 3 and FIG. 4B. It should be noted that a case of FIG. 4A is also similar. Here, the state in which the magnetization orientations of the magnetization inversion region 13 and the pinned layer 30 are parallel is related to the data "0". In the data "0", the magnetization orientation of the magnetization inversion region 13 is the +Y-direction, and a domain wall DW exists on the second boundary B2. On the other hand, the state in which the magnetization orientations of the magnetization inversion region 13 and the pinned layer 30 are anti-parallel is related to the data "1". In the data "1" state, the magnetization orientation of the magnetization inversion region 13 is the −Y-direction, and the domain wall DW exists on the first boundary B1.

In this exemplary embodiment, a write current $I_W$ does not flow in the direction penetrating through the MTJ, and it flows inside the magnetic recording layer 10. Specifically, when the data "1" is written (first write), a first write current $I_{W1}$ flows from the first magnetization fixed region 11 through the magnetization inversion region 13 to the second magnetization fixed region 12. In this case, the electrons (spin electrons) are injected from the second magnetization fixed region 12 to the magnetization inversion region 13. The injected electrons have influence on a magnetic moment of the magnetization inversion region 13 by their spin. As a result, the magnetization orientation of the magnetization inversion region 13 is switched to the direction of the second magnetization fixed region 12. In short, the spin transfer effect causes the magnetization of the magnetization inversion region 13 to be switched to change its magnetization orientation into the −Y-direction (Spin Transfer Magnetization Switching).

On the other hand, when the data "0" is written (second write), a second write current $I_{W2}$ flows from the second magnetization fixed region 12 through the magnetization inversion region 13 to the first magnetization fixed region 11. In this case, the electrons are injected or transferred from the first magnetization fixed region 11 to the magnetization inversion region 13. As a result, the magnetization of the magnetization inversion region 13 is switched, and its magnetization orientation is changed to the +Y-direction. In this way, according to this exemplary embodiment, the magnetization orientation of the magnetization inversion region 13 is switched by the write currents $I_{W1}$ and $I_{W2}$ that flatly flow inside the magnetic recording layer 10. The first magnetization fixed region 11 and the second magnetization fixed region 12 functions as a supply source of the electrons having the different spins.

The above-mentioned write operation can be described from the viewpoint of "Domain Wall Motion". When the data "1" is written, the electrons are moved from the second magnetization fixed region 12 to the first magnetization fixed region 11. At this time, the domain wall DW is moved from the second boundary B2 to the first boundary B1 in correspondence with the motion direction of the electrons. On the other hand, when the data "0" is written, the electrons are moved from the first magnetization fixed region 11 to the second magnetization fixed region 12. At this time, the domain wall DW is moved from the first boundary B1 to the second boundary B2 in correspondence with the motion direction of the electrons. In short, the domain wall DW inside the magnetic recording layer 10 is reciprocated in the manner of "Seesaw" or "Flow Meter" between the first boundary B1 and the second boundary B2. Since the domain wall DW is moved inside the magnetization inversion region 13, the magnetization inversion region 13 can be also referred to as a "Domain Wall Motion Region". The magnetic memory cell 1 according to this exemplary embodiment is said to store the data, depending on the position of the domain wall DW.

As mentioned above, since the write currents $IW_1$ and $IW_2$ do not penetrate through the MTJ, the deterioration of the tunnel barrier layer 20 in the MTJ is suppressed. Also, since the data write is carried out by the spin transfer method, the write currents $IW_1$ and $IW_2$ can be decreased in association with the contraction of the memory cell size. Moreover, as the memory cell size is contracted, the motion distance of the domain wall DW is made shorter. Thus, the write speed is increased in association with the finer structure of the memory cell.

It should be noted that the read of the data is as follows. When the data is read, the read current is supplied to flow between the pinned layer 30 and the magnetization inversion region 13. For example, the read current flows from one of the first magnetization fixed region 11 and the second magnetization fixed region 12 through the magnetization inversion region 13 and the tunnel barrier layer 20 to the pinned layer 30. Or, the read current flows from the pinned layer 30 through the tunnel barrier layer 20 and the magnetization inversion region 13 to one of the first magnetization fixed region 11 and the second magnetization fixed region 12. A resistance value of the magneto-resistance element is detected based on the read current or the read potential, and the magnetization orientation of the magnetization inversion region 13 is sensed.

STRUCTURE EXAMPLE 2

Figure 6A:
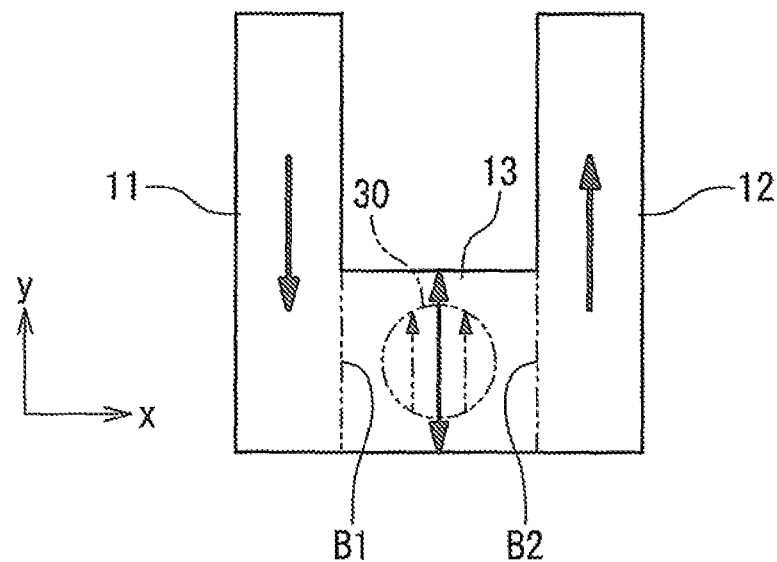
FIG. 6A is a plan view showing one example of a different structure of the magnetic memory cell shown in FIG. 2.
Figure 6B:
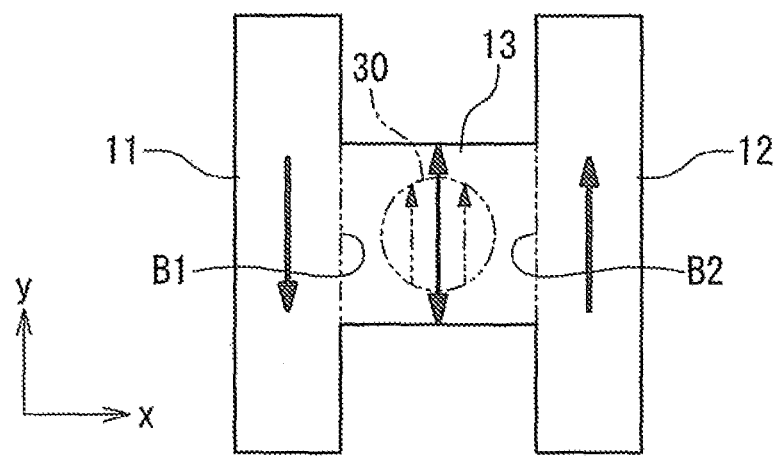
FIG. 6B is a plan view showing another example of the different structure of the magnetic memory cell shown in FIG. 2.
Figure 7:
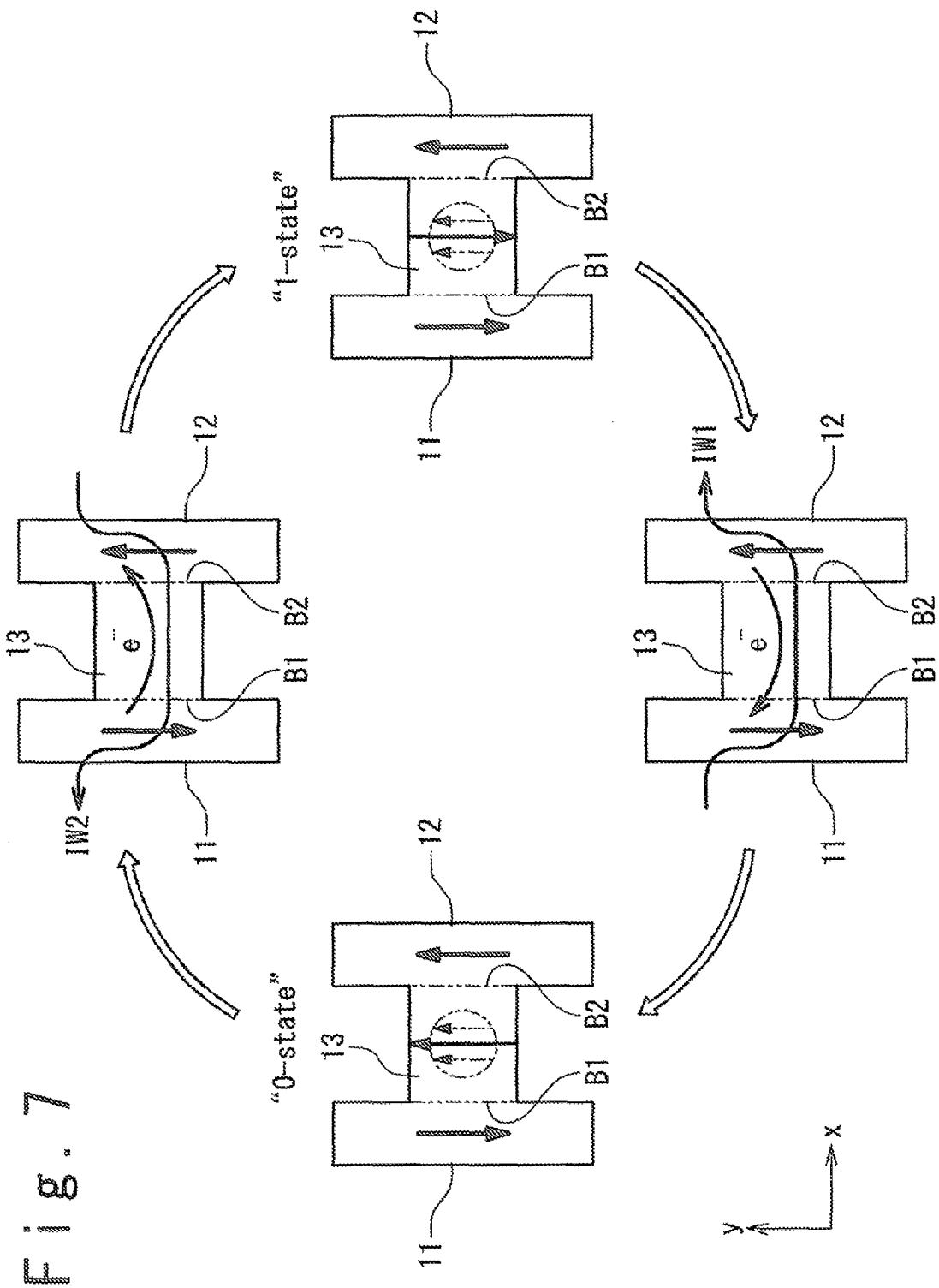
FIG. 7 is a plan view showing the principle of the data write to the magnetic memory cell shown in FIG. 6A and FIG. 6B.

The magnetization orientation of the first magnetization fixed region 11 and the magnetization orientation of the second magnetization fixed region 12 are not limited to the orientations shown in FIG. 4A and FIG. 4B. FIG. 6A and FIG. 6B are diagrams schematically showing another example of the shape and magnetization orientation of the magnetic recording layer 10 on the XY plane. The magnetization orientation of the first magnetization fixed region 11 and the magnetization orientation of the second magnetization fixed region 12 may be opposite. FIG. 7 is a diagram schematically showing the principle of writing the data to the magnetic memory cell 1 of the structure shown in FIG. 2, FIG. 3 and FIG. 6B. It should be noted that a case of FIG. 6A is also similar. FIG. 7 corresponds to FIG. 5, and the same description is properly omitted.

The magnetization orientation of the first magnetization fixed region 11 is fixed to the −Y-direction. Also, the magnetization orientation of the second magnetization fixed region 12 is fixed to the +Y-direction. In short, the magnetization of the first magnetization fixed region 11 and the magnetization of the second magnetization fixed region 12 are oriented opposite to each other. Also, the magnetization orientation of the pinned layer 30 is assumed to be fixed to the +Y-direction. In the data "0" state, the magnetization orientation of the magnetization inversion region 13 is the +Y-direction, and the domain wall DW exists on the first boundary B1. On the other hand, in the data "1" state, the magnetization orientation of the magnetization inversion region 13 is the −Y-direction, and the domain wall DW exists on the second boundary B2.

When the data "1" is written (first write), the second write current $I_{W2}$ flows from the second magnetization fixed region 12 through the magnetization inversion region 13 to the first magnetization fixed region 11. In this case, the electrons are injected or transferred from the first magnetization fixed region 11 to the magnetization inversion region 13. As a result, the magnetization of the magnetization inversion region 13 is switched, and its magnetization orientation is changed to the −Y-direction. In coincidence with the motion direction of the electrons, the domain wall DW is moved from the first boundary B1 to the second boundary B2. On the other hand, when the data "0" is written (second write), the first write current $I_{W1}$ flows from the first magnetization fixed region 11 through the magnetization inversion region 13 to the second magnetization fixed region 12. In this case, the electrons are transferred from the second magnetization fixed region 12 to the magnetization inversion region 13. As a result, the magnetization of the magnetization inversion region 13 is switched, and its magnetization orientation is changed to the +Y-direction. In coincidence with the motion direction of the electron, the domain wall DW is moved from the second boundary B2 to the first boundary B1.

Even by the structure shown in FIG. 7, the same effect as the structure example 1 is obtained. Also, the read of the data is also similar to the structure example 1.

As mentioned above, in the magnetic memory cell 1 according to this exemplary embodiment, the magnetic recording layer 10 has the first magnetization fixed region 11, the second magnetization fixed region 12 and the magnetization inversion region 13. This structure can be also considered as following. In short, a usual magneto-resistance element is further provided with a "First Magnetization Fixed Section" corresponding to the first magnetization fixed region 11 and a "Second Magnetization Fixed Section" corresponding to the second magnetization fixed region 12. The usual magneto-resistance element contains a free layer, a pinned layer, and a non-magnetic layer put between them. The free layer, the first magnetization fixed section and the second magnetization fixed section are formed on the same flat surface. The first magnetization fixed section is connected to the free layer on the first boundary B1, and the second magnetization fixed section is connected to the free layer on the second boundary B2. The magnetization orientation (first direction) of the first magnetization fixed section and the magnetization orientation (second direction) of the second magnetization fixed section are opposite to each other. The write current, which planarly flows between the first magnetization fixed section and the second magnetization fixed section, causes the domain wall to be moved between the first boundary B1 and the second boundary B2, and the magnetization of the free layer is switched.

1-2. Circuit Configuration

Figure 8:
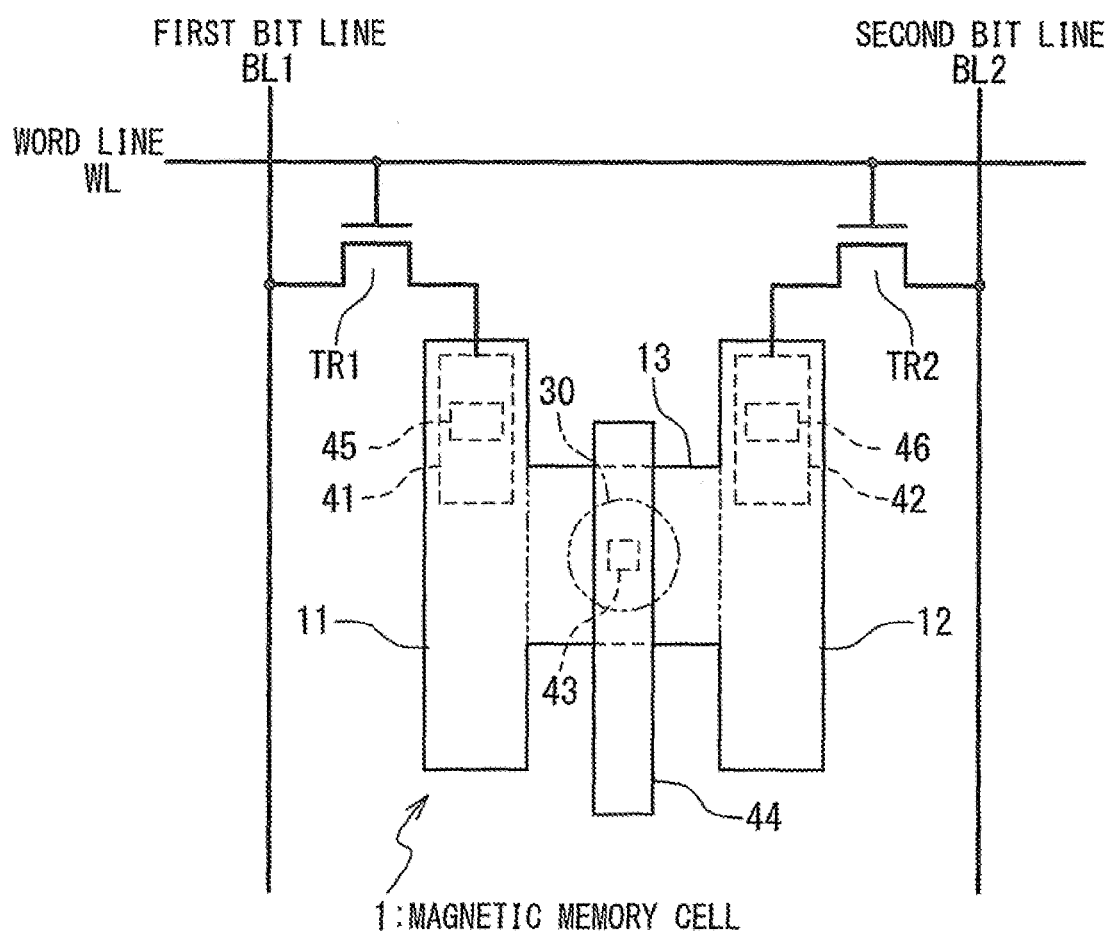
FIG. 8 is a plan view schematically showing a circuit configuration of the magnetic memory cell according to the first exemplary embodiment.

The circuit configuration for making the write currents and $I_{W1}$ and $I_{W2}$ to flow through the magnetic memory cell 1 according to this exemplary embodiment will be described below. FIG. 8 is a plan view showing one example of the circuit configuration of the magnetic memory cell 1. Although FIG. 8 shows the magnetic memory cell 1 of the structure shown in FIG. 2, it can be applied to even the magnetic memory cell 1 of the structure shown in FIG. 3. Also, FIG. 9A is a section view schematically showing the structure of the magnetic memory cell 1 shown in FIG. 8. Here, FIG. 9A shows the magnetic memory cell 1 of the structure shown in FIG. 2. However, in case of the magnetic memory cell 1 of the structure shown in FIG. 3, it is as shown in FIG. 9B.

The first magnetization fixed region 11 of the magnetic recording layer 10 is connected through a contact 45 to a first lower electrode 41. The second magnetization fixed region 12 is connected through a contact 46 to a second lower electrode 42. The first lower electrode 41 is connected to one of the source/drain of a first transistor TR1. The other of the source/drain of the first transistor TR1 is connected to a first bit line BL1. Also, the second lower electrode 42 is connected to one of the source/drain of a second transistor TR2. The other of the source/drain of the second transistor TR2 is connected to a second bit line BL2. The gate of the first transistor TR1 and the gate of the second transistor TR2 are connected to a word line WL.

The pinned layer 30 is formed through the tunnel barrier layer 20 on the magnetization inversion region 13 of the magnetic recording layer 10. An upper electrode 43 is formed on the pinned layer 30, and a read line 44 is connected to the upper electrode 43. The direction of the read line 44 is arbitrary. This read line 44 may be connected to a selection transistor or a ground.

FIG. 10A is a table summarily showing the data read/write method in case of the circuit configuration shown in FIG. 8 and FIG. 9A or FIG. 9B. This shows a case of the magnetic memory cell 1 shown in FIG. 4A, FIG. 4B and FIG. 5. In both of the write and the read, the word line WL connected to a target memory cell is selected, and its potential is set to "High". Consequently, the first transistor TR1 and the second transistor TR2 are turned ON.

When the data "1" is written, the potentials of the first bit line BL1 and the second bit line BL2 are set to "High" and "Low", respectively. As a result, the first write current IW1 flows from the first bit line BL1 through the first transistor TR1, the magnetic recording layer 10 and the second transistor TR2 to the second bit line BL2. On the other hand, when the data "0" is written, the potentials of the first bit line BL1 and the second bit line BL2 are set to "Low" and "High", respectively. As a result, the second write current IW2 flows from the second bit line BL2 through the second transistor TR2, the magnetic recording layer 10 and the first transistor TR1 to the first bit line BL1.

When the data is read, for example, the potential of the first bit line BL1 is set to "High", and the second bit line BL2 is set to "Open". Consequently, the read current flows from the first bit line BL1 through the first transistor TR1 and the MTJ to the read line 44. Or, the first bit line BL1 is set to "Open", and the potential of the second bit line BL2 is set to "High". Consequently, the read current flows from the second bit line BL2 through the second transistor TR2 and the MTJ to the read line 44.

It should be noted that the case of the magnetic memory cell 1 shown in FIG. 6A, FIG. 6B and FIG. 7 is as shown in FIG. 10B. FIG. 10B is a table summarily indicating the data read/write method in case of the circuit configuration shown in FIG. 8 and FIG. 9A or FIG. 9B. Excluding that the direction of the write current is opposite between a case where the data "1" is written and a case where the data "0" is written, the configuration is similar to a case of FIG. 10A. Thus, its description is omitted.

Figure 11:
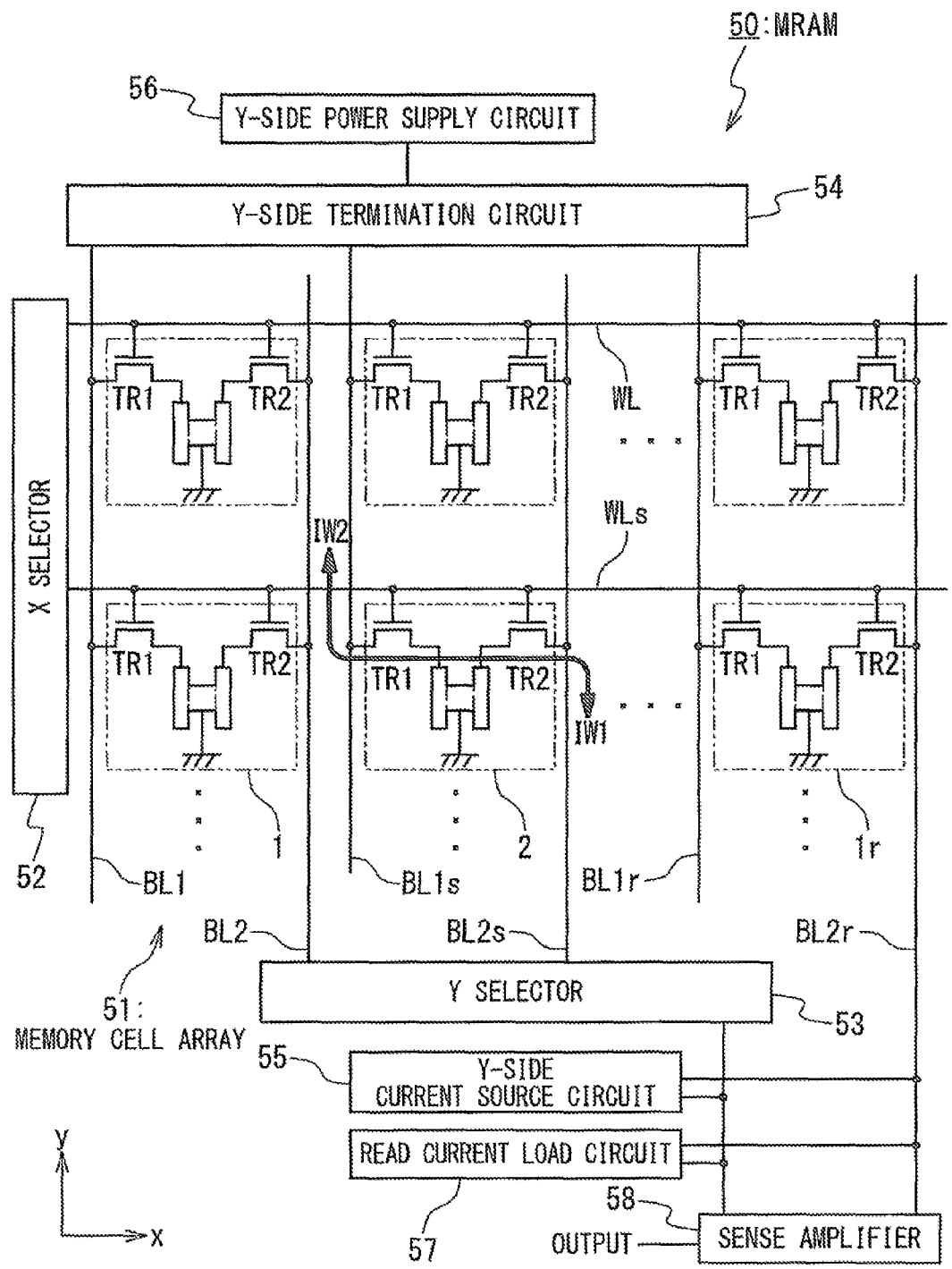
FIG. 11 is a circuit block diagram showing one example of a circuit configuration, corresponding to FIG. 9A, of the MRAM according to the first exemplary embodiment.

A peripheral circuit for controlling the word line WL, the first bit line BL1 and the second bit line BL2 would be properly designed by one skilled in the art. FIG. 11 is a circuit block diagram showing one example of the configuration of the peripheral circuit.

In FIG. 11, a MRAM 50 has a memory cell array 51 in which the above magnetic memory cells 1 are arranged in a matrix. This memory cell array 51 includes reference cells 1r, one of which is referred when the data is read, together with the magnetic memory cells 1 used to record the data. The basic structure of the reference cell 1r is equal to that of the magnetic memory cell 1. In each magnetic memory cell 1, the read line 44 is assumed to be connected to a ground line. Also, as mentioned above, one word line and a bit line pair (the first bit line BL1 and the second bit line BL2) are laid for each of the magnetic memory cells 1.

The plurality of word lines WL are connected to an X selector 52. The X selector 52 selects one word line WL connected to a target memory cell 1s as a selection word line WLs from the plurality of word lines WL, in both of the cases of the data write and the data read.

The plurality of first bit lines BL1 are connected to a Y-side termination circuit 54, and the plurality of second bit lines BL2 are connected to a Y selector 53. The Y selector 53 selects one second bit line BL2 connected to the target memory cell 1s, as a second selection bit line BL2s, from the plurality of second bit lines BL2, when the data is written. The Y-side termination circuit 54 selects one first bit line BL1 connected to the target memory cell 1s, as a first selection bit line BL1s, from the plurality of first bit lines BL1, when the data is written. In this way, the target memory cell 1s is selected.

A Y-side current source circuit 55 is a current source for outputting or inputting predetermined write current $I_{W1}$ or $I_{W2}$ to or from the selected second bit line BL2s, when the data is written. This Y-side current source circuit 55 contains a current selector unit for determining a direction of the write current, and a constant current source for supplying a constant current. A Y-side power source circuit 56 supplies a predetermined voltage to the Y-side termination circuit 54, when the data is written. As a result, the write current $I_{W1}$ or $I_{W2}$ supplied by the Y-side current source circuit 55 flow to the Y selector 53 on the basis of the data written to the target memory cell 1s or flow out from the Y selector 53. The X selector 52, the Y selector 53, the Y-side termination circuit 54, the Y-side current source circuit 55 and the Y-side power source circuit 56 constitute a "Write Current Supplying Circuit" for supplying the write current $I_{W1}$ or $I_{W2}$ to the magnetic memory cell 1.

When the data is read, the first bit line BL1 is set to "Open". A read current load circuit 57 makes a predetermined read current to flow through the selected second bit line BL2, when the data is read. Also, the read current load circuit 57 makes a predetermined current to flow through a reference second bit line BL2r connected to the reference cell 1r. A sense amplifier 58 reads the data from the target memory cell is in accordance with a potential difference between the reference second bit line BL2r and the selected second bit line BL2r, and outputs the data.

1-3. Fixation of Magnetization

The method of fixing the magnetizations of the first magnetization fixed region 11 and the second magnetization fixed region 12 will be described below. As the method of fixing the magnetization, there could be considered the following three patterns: an exchange coupling, a static coupling and a magnetic anisotropy.

(Exchange Coupling)

Figure 12:
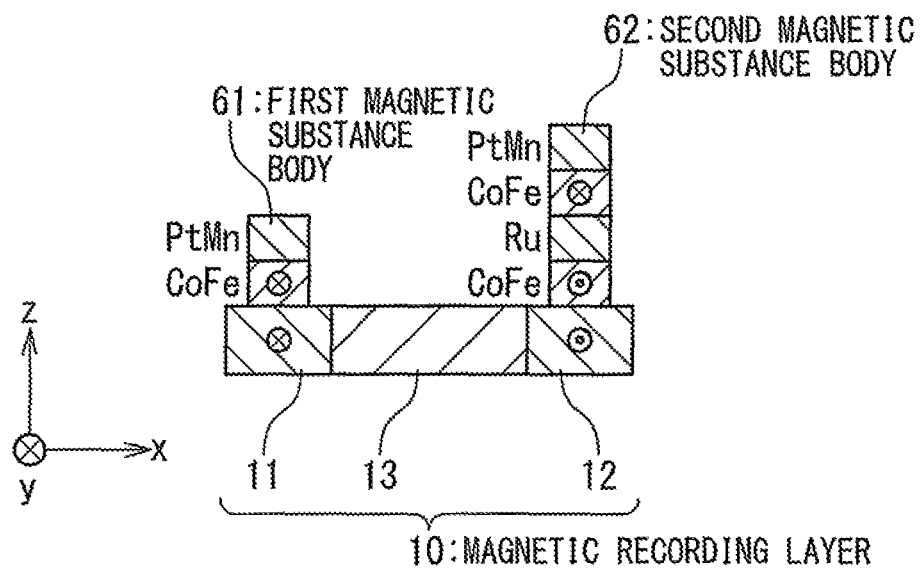
FIG. 12 is a side view showing one example of a method of fixing a magnetization orientation in the magnetization fixing region.

The structure example shown in FIG. 4B is exemplified. FIG. 12 is a side view schematically showing the magnetic memory cell 1 that contains a magnetization fixing means. This magnetic memory cell 1 contains a first magnetic substance body 61 and a second magnetic substance body 62 as the magnetization fixing means. The first magnetic substance body 61 adds a bias magnetic field of the +Y-direction to the first magnetization fixed region 11. On the other hand, the second magnetic substance body 62 applies a bias magnetic field of the −Y-direction to the second magnetization fixed region 12.

Specifically, the first magnetic substance body 61 includes a ferromagnetic layer having magnetization in the +Y-direction, and the ferromagnetic layer is formed to be adhered to the first magnetization fixed region 11. In this first magnetic substance body 61, the magnetization orientation of the first magnetization fixed region 11 is fixed to the +Y-direction through "Exchange Coupling". On the other hand, the second magnetic substance body 62 includes a ferromagnetic layer having magnetization in the −Y-direction, and the ferromagnetic layer is formed to be adhered to the second magnetization fixed region 12. In this second magnetic substance body 62, the magnetization orientation of the second magnetization fixed region 12 is fixed to the −Y-direction through the exchange coupling.

As shown in FIG. 12, the first magnetic substance body 61 is a lamination film of, for example, CoFe/PtMn. This configuration of the lamination film is generally used in the pinned layer. As the magnetization orientation of the pinned layer is fixed, the magnetization orientation of a CoFe layer is firmly fixed to the +Y-direction, as a source to fix the magnetization orientation of the first magnetization fixed region 11. Also, the second magnetic substance body 62 is a lamination film of, for example, CoFe/Ru/CoFe/PtMn. The configuration of its upper half is similar to that of the first magnetic substance body 61, and the magnetization orientation of a CoFe layer is fixed to the +Y-direction. The CoFe layer of the lower portion is anti-ferromagnetically coupled to the CoFe layer in the upper portion through a Ru layer, and its magnetization orientation is fixed to the −Y-direction. The CoFe layer having the magnetization of this −Y-direction is adhered to the second magnetization fixed region 12.

In this way, in FIG. 12, the film configuration is different between the first magnetic substance body 61 and the second magnetic substance body 62. This is because the bias magnetic fields opposite to each other are required to be applied to the first magnetization fixed region 11 and the second magnetization fixed region 12. Also, instead of the different film configuration, the first magnetic substance body 61 and the second magnetic substance body 62 may be made of different materials. Similarly, the first magnetic substance body 61 and second magnetic substance body 62 may be applied to even "Structure Examples" shown in FIG. 4A, FIG. 6A and FIG. 6B.

The magnetization fixing based on the exchange coupling may be applied to examples other than the structure example shown in FIG. 3.

(Static Coupling)

Figure 13:
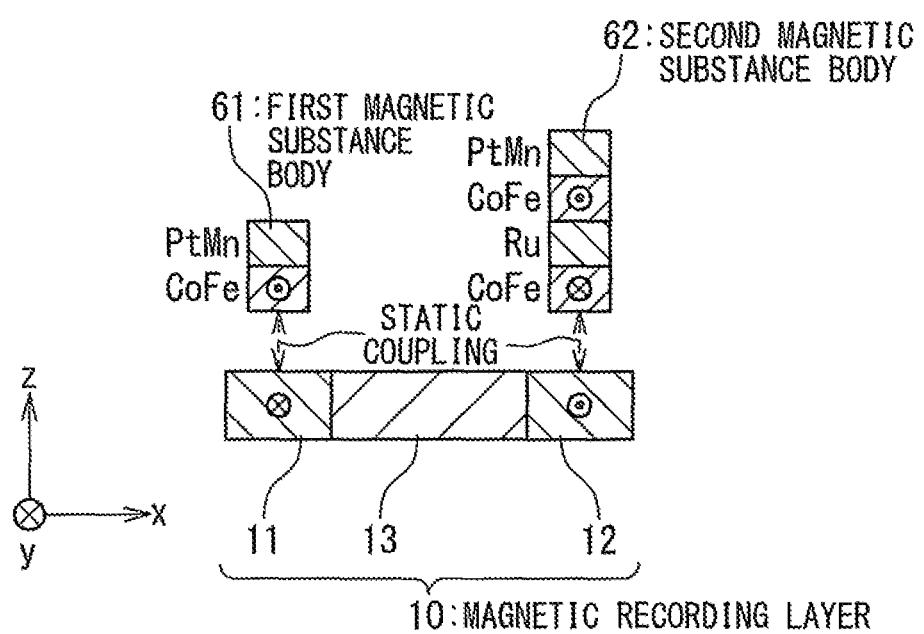
FIG. 13 is a side view showing another example of a method of fixing a magnetization orientation in the magnetization fixing region.

The structure example shown in FIG. 4B is exemplified. FIG. 13 is a side view schematically showing the magnetic memory cell 1 containing magnetization fixing means. This magnetic memory cell 1 contains the first magnetic substance body 61 and the second magnetic substance body 62 as the magnetization fixing means. The first magnetic substance body 61 applies bias magnetic field in the +Y-direction to the first magnetization fixed region 11. On the other hand, the second magnetic substance body 62 applies the bias magnetic field in the −Y-direction to the second magnetization fixed region 12.

Specifically, the first magnetic substance body 61 includes a ferromagnetic layer having, the magnetization of the −Y-direction opposite to the +Y-direction, and its ferromagnetic layer is formed away from the first magnetization fixed region 11. In this first magnetic substance body 61, the magnetization orientation of the first magnetization fixed region 11 is fixed to the +Y-direction by "Exchange Coupling". On the other hand, the second magnetic substance body 62 includes a ferromagnetic layer having the magnetization in the +Y-direction opposite to the −Y-direction, and its ferromagnetic layer is formed away from the second magnetization fixed region 12. In this second magnetic substance body 62, the magnetization orientation of the second magnetization fixed region 12 is fixed to the −Y-direction by the exchange coupling.

As shown in FIG. 13, the second magnetic substance body 62 is a lamination film of, for example, CoFe/Ru/CoFe/PtMn. Also, the first magnetic substance body 61 is a lamination film of, for example, CoFe/PtMn. The reason why the film configuration is different between the first magnetic substance body 61 and the second magnetic substance body 62 is same as the case of the exchange coupling. Also, similarly, the first magnetic substance body 61 and the second magnetic substance body 62 may be applied to even the structure examples shown in FIG. 4A, FIG. 6A and FIG. 6B.

Figure 14:
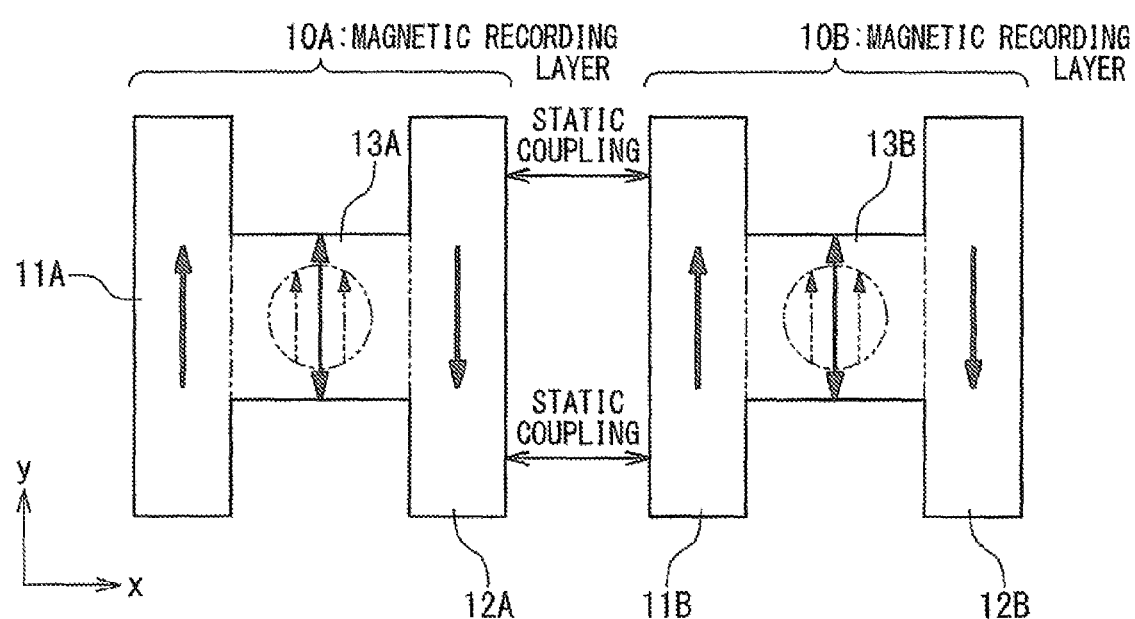
FIG. 14 is a side view showing still another example of a method of fixing the magnetization orientation in the magnetization fixing region.

FIG. 14 is a diagram schematically showing the configuration for collectively fixing the magnetizations for the memory cells of two bits. As shown in FIG. 14, a second magnetization fixed region 12A in a magnetic recording layer 10A is placed at a position adjacent to a first magnetization fixed region 11B in an adjacent magnetic recording layer 10B. This second magnetization fixed region 12A is coupled to the first magnetization fixed region 11B by the static coupling, and it is magnetically stable. That is, the magnetization orientation of the second magnetization fixed region 12A and the magnetization orientation of the first magnetization fixed region 11B are mutually fixed. The magnetization orientation of the first magnetization fixed region 11 in the adjacent magnetic memory cell is fixed through the static coupling to the second magnetization fixed region 12B (not shown). It should be noted that there is not adjacent magnetic memory cell in the end of the memory cell array. Accordingly, in that case, the method as shown in FIG. 13 is used to fix the magnetization.

The magnetization fixing based on the static coupling may be applied to the structure examples shown in FIG. 4A, FIG. 6A and FIG. 6B.

(Magnetization Fixing of Using Shape of Magnetic Substance)

Figure 15:
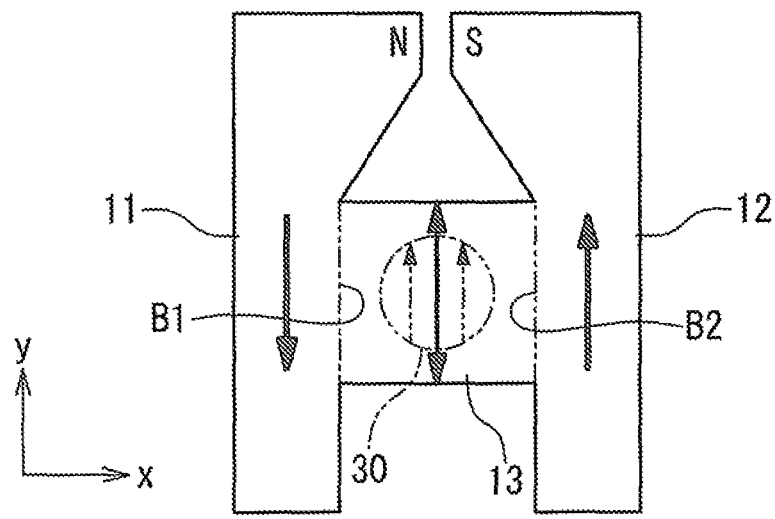
FIG. 15 is a side view showing still another example of the method to fix a magnetization orientation in the magnetization fixing region.

With regard to the structure examples shown in FIG. 4A, FIG. 4B, FIG. 6A and FIG. 6B, the above exchange coupling and static coupling may not be always applied. FIG. 15 is a diagram schematically showing the magnetic memory cell 1 in which the shape of the magnetic substance body is used to carry out the magnetization fixing. As shown in FIG. 15, the first magnetization fixed region 11 and the second magnetization fixed region 12 are made partially close to each other to a degree that the first magnetization fixed region 11 and the second magnetization fixed region 12 are statically coupled. Thus, the magnetization orientations of the first magnetization fixed region 11 and the second magnetization fixed region 12 are fixed opposite to each other. As the portions it is preferable that it is the ends that are made close to each other.
(Magnetization Fixing of Using Auxiliary Magnetic Substance Body)

Figure 16:
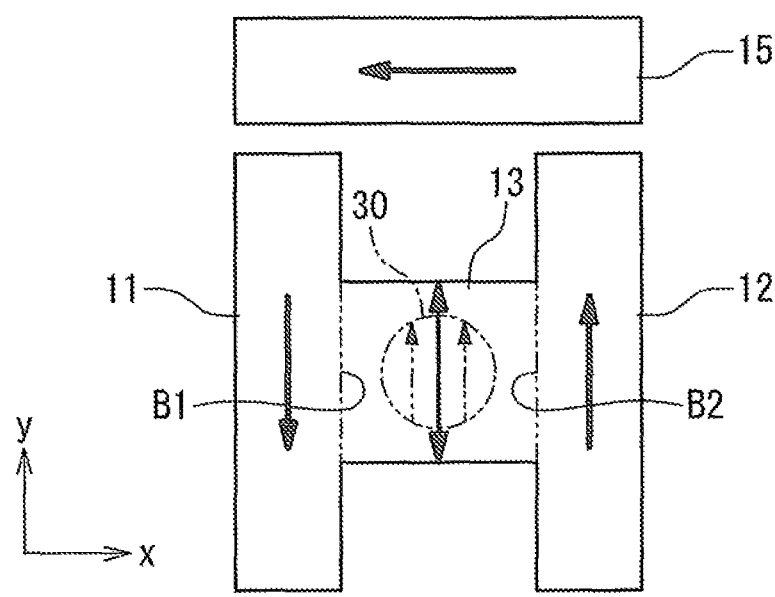
FIG. 16 is a side view showing still another example of a method of fixing a magnetization orientation in the magnetization fixing region.

Also, FIG. 16 is a diagram schematically showing the magnetic memory cell 1 in which an auxiliary magnetic substance body is used to carry out the magnetization fixing. As shown in FIG. 16, the auxiliary magnetic substance body 15 that is statically coupled to both of the first magnetization fixed region 11 and the second magnetization fixed region 12 is arranged, to allow the magnetization directions of the first magnetization fixed region 11 and the second magnetization fixed region 12 to be fixed to the directions opposite to each other.

In this case, the magnetization orientation of the auxiliary magnetic substance body 15 may be set to the −X-direction or the +X-direction, at an initial annealing step. The magnetization orientations of the first magnetization fixed region 11 and the second magnetization fixed region 12 may be held in the +Y-direction or the −Y-direction through the static coupling to the auxiliary magnetic substance body 15. This case is preferable from the viewpoint that magnetization fixing means such as the first magnetic substance body 61 and the second magnetic substance body 62 are not required, resulting in reducing components. That is, the "H-shaped" magnetic recording layer 10 has the preferable shape, from the viewpoint of the magnetization fixing.

Also, FIG. 17 is a diagram schematically showing another magnetic memory cell 1 in which the auxiliary magnetic substance body is used to carry out the magnetization fixing. As shown in FIG. 17, external magnetic field whose orientation is same as an orientation in which the magnetization of the auxiliary magnetic substance body is fixed may be uniformly applied to the magnetic memory cell 1. For example, a magnet of several Oe is placed in a package. This placement stabilizes the fixing of the magnetization and improves thermal disturbance durability. In addition thereto, the above exchange coupling (refer to FIG. 12) and static coupling (refer to FIG. 13) may be applied in combination. In this case, the fixing of the magnetization is further stabilized.

1-4. Effect

As mentioned above, according to the present invention, a new read/write method is provided with regard to the randomly accessible MRAM. The data write is attained through the domain wall motion caused by the spin transfer inside the magnetic recording layer 10. The data read is attained by using the MTJ. Thus, the following effect will be attained.

At first, as compared with the asteroid method, an excellent selecting property of the memory cell is attained. In case of the asteroid method, a deviation in threshold of the write magnetic field reduces the selecting property of the memory cell in a two-dimensional memory cell array. However, according to the spin transfer method, the write current acts only on the target memory cell. Thus, disturbance is greatly decreased. That is, the selection write property is improved.

Also, as compared with the asteroid method and the toggle method, a scaling property of the write current is improved. In case of the asteroid method and the toggle method, the switching magnetic field required to switch the magnetization of the magnetic recording layer becomes greater, substantially inversely proportional to the memory cell size. In short, as the structure of the memory cell is made finer, the write current tends to be increased. However, according to the spin transfer method, a threshold of the magnetization switching depends on a current density. As the memory cell size is contracted, the current density is increased. Thus, the write current can be decreased in association with the finer structure of the memory cell. In other words, even if the memory cell size is contracted, the write current is not required to be increased. In this meaning, the scaling property of the write current is improved. This is important in realization a large capacity of the MRAM.

Also, as compared with the asteroid method and the toggle method, a current magnetic field conversion efficiency increases. In case of the asteroid method and the toggle method, the write current is consumed in the form of Joule heat. In order to improve the current magnetic field conversion efficiency, a dedicated write interconnection such as a flux keeper or a yoke structure was required to be provided. However, this leads to the complexity of a manufacturing process and the increase of an interconnection inductance. On the other hand, according to the spin transfer method, the write current directly contributes to the spin transfer. Thus, the current magnetic field conversion efficiency increases. Consequently, the complexity of the manufacturing process and the increase of the interconnection inductance are prevented.

Moreover, as compared with the conventional spin transfer magnetization switching, the deterioration of the MTJ (tunnel barrier layer 20) is suppressed. The conventional spin transfer magnetization switching is attained by the CPP (Current Perpendicular to Plane) method, and the write current is vertically transferred into the film surface. The write current when a data is written is extremely larger than the read current. Thus, there was a fear that the tunnel barrier layer 20 was destroyed due to the large current. However, according to the write method of the present invention, a current route at the time of read and a current route at the time of write are separated. Specifically, when the data is written, the write currents $I_{W1}$ and $I_{W2}$ do not penetrate through the MTJ, and they flows inside the magnetic recording layer 10. When the data is written, the large current is not required to be vertically transferred into the MTJ film surface. Therefore, the deterioration of the tunnel barrier layer 20 in the MTJ is suppressed.

Moreover, the write speed increases in association with realization of a finer structure of the memory cell. This is because in the present invention, the data write is attained through the domain wall motion inside the magnetic recording layer 10. The fact that the memory cell size is contracted implies that the motion distance of the domain wall DW is made shorter. Thus, the write speed increases in association with the contraction of the memory cell size.

According to the present invention, the above-mentioned effects are obtained at the same time. In order to attain the MRAM of a high integration, a high speed operation and a small power consumption amount, the technique according to the present invention is very useful.

Figure 18A:
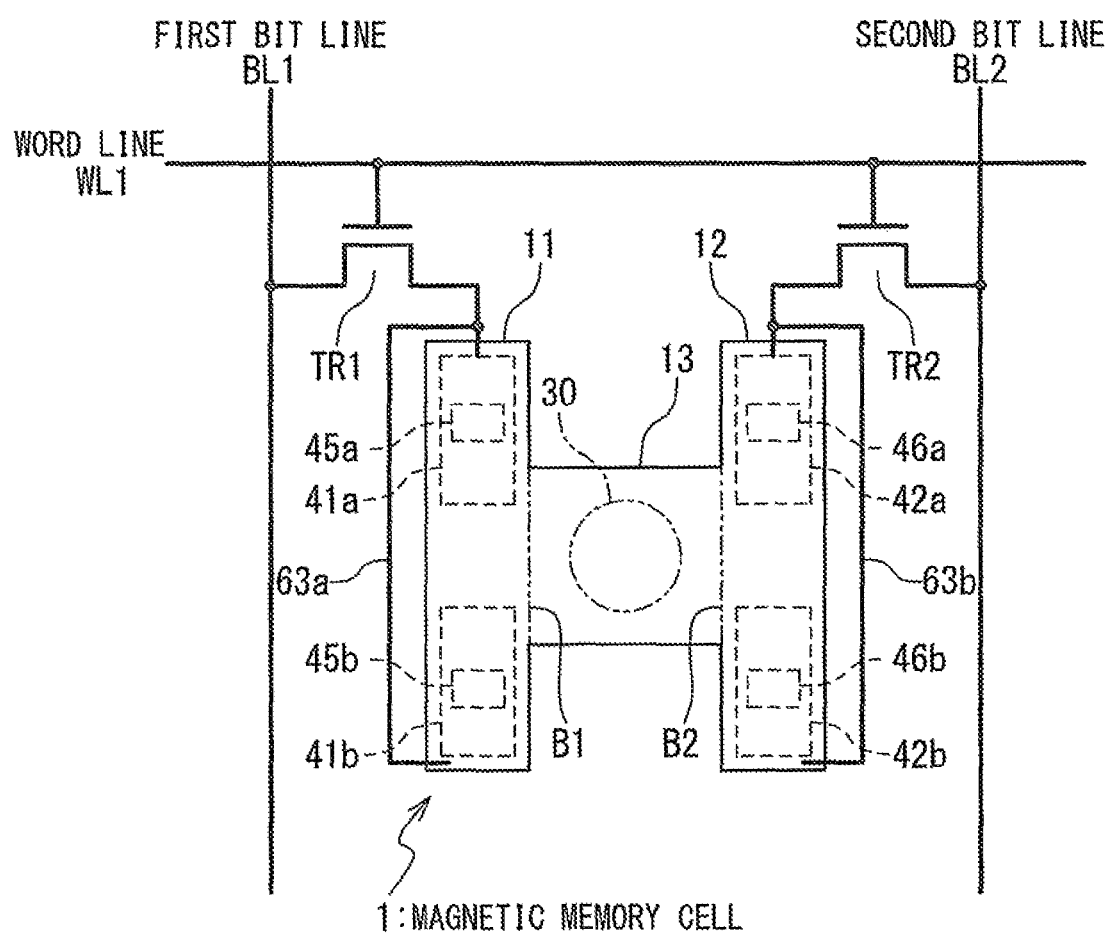
FIG. 18A is a plan view schematically showing a circuit configuration of another magnetic memory cell according to the first exemplary embodiment.

It should be noted that instead of FIG. 8, other examples are considered. FIG. 18A and FIG. 18g are plan views showing the other examples of the circuit configuration of the magnetic memory cell 1, respectively. FIG. 18A differs from FIG. 8 in that currents are supplied to or drawn out from two portions of each of the first magnetization fixed region 11 and the second magnetization fixed region 12. However, since their operations are similar to FIG. 8, their descriptions are omitted. In the circuit configuration of the magnetic memory cell 1 in FIG. 18B, two word lines of a first word line WL1 and a second word line WL2 are provided. However, both of the first word line WL1 and the second word line WL2 are selected at the time of the write operation and at the time of the read operation, thereby carrying out the operation similar to FIG. 18A. Therefore, their descriptions are omitted.

Figure 18B:
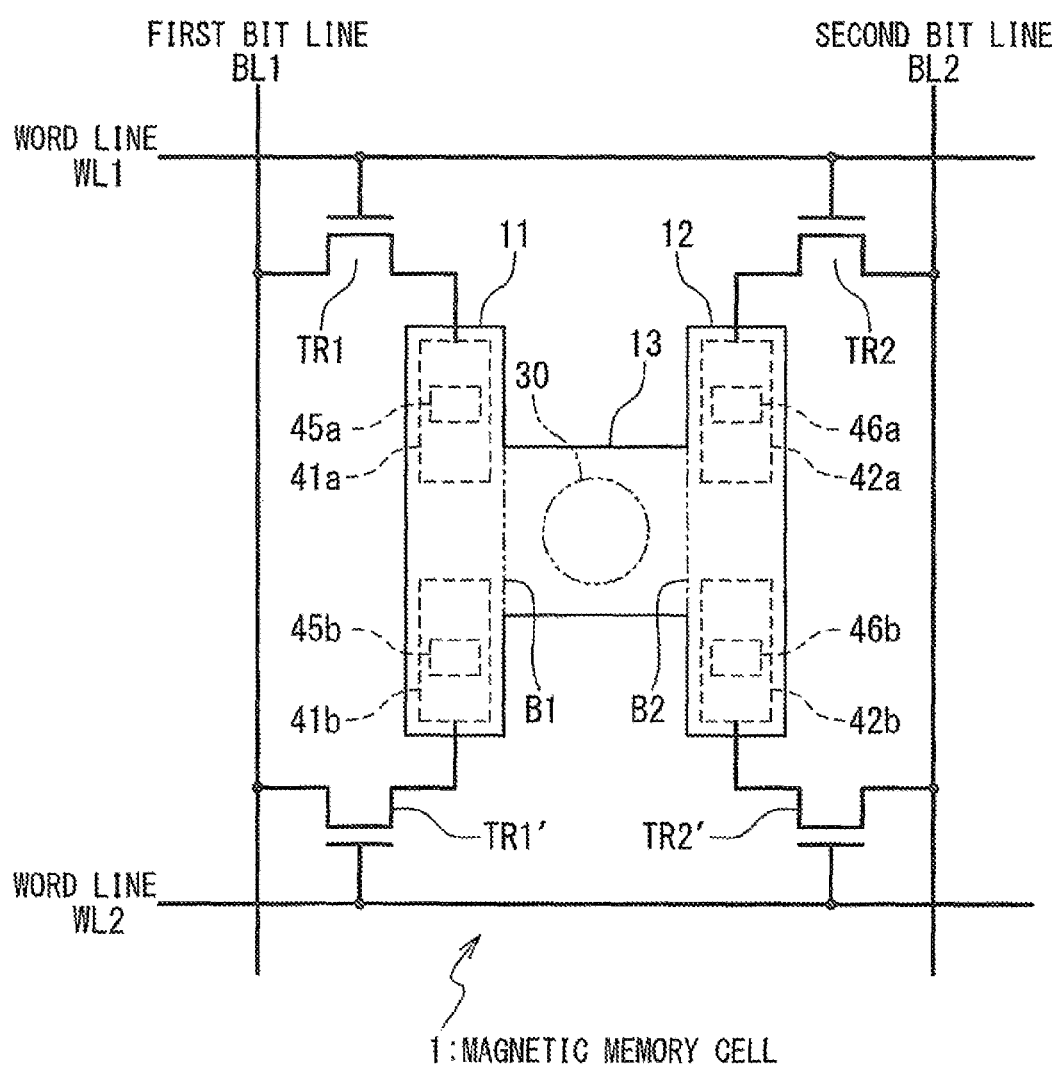
FIG. 18B is a plan view schematically showing a circuit configuration of still another magnetic memory cell according to the first exemplary embodiment.

In case of FIG. 18A and FIG. 18B, the write current flows to the magnetization inversion region 13 from both ends of the first magnetization fixed region 11 or both ends of the second magnetization fixed region 12. That is, the write current flows from both end sides of the first magnetization fixed region 11 or both end sides of the second magnetization fixed region 12 in the domain wall (B1 or B2). Thus, the magnetization switching efficiency in the magnetic recording layer 10 is improved.

Figure 19A:
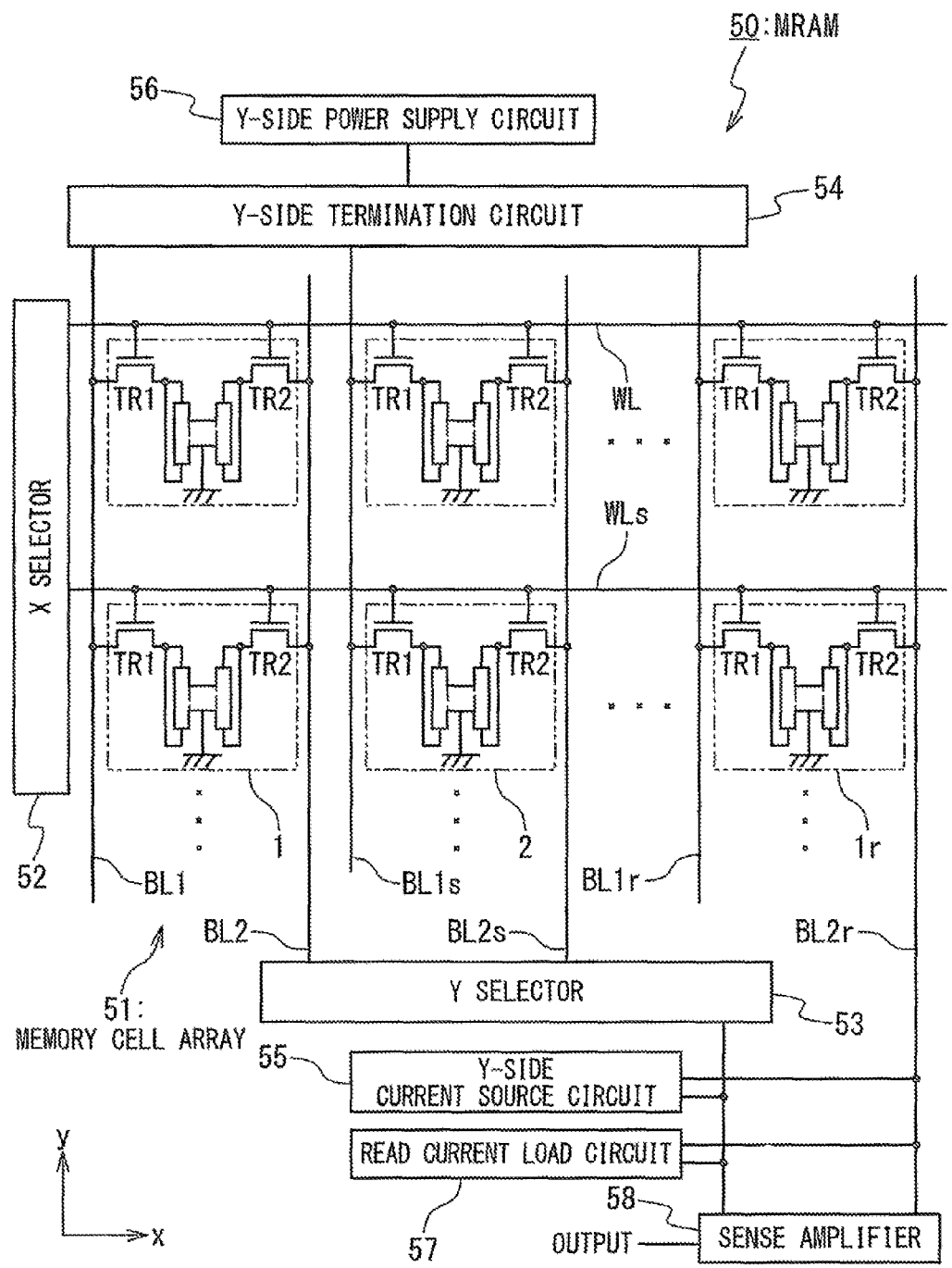
FIG. 19A is a circuit block diagram showing one example of the circuit configuration, corresponding to FIG. 18A, of the MRAM according to the first exemplary embodiment.
Figure 19B:
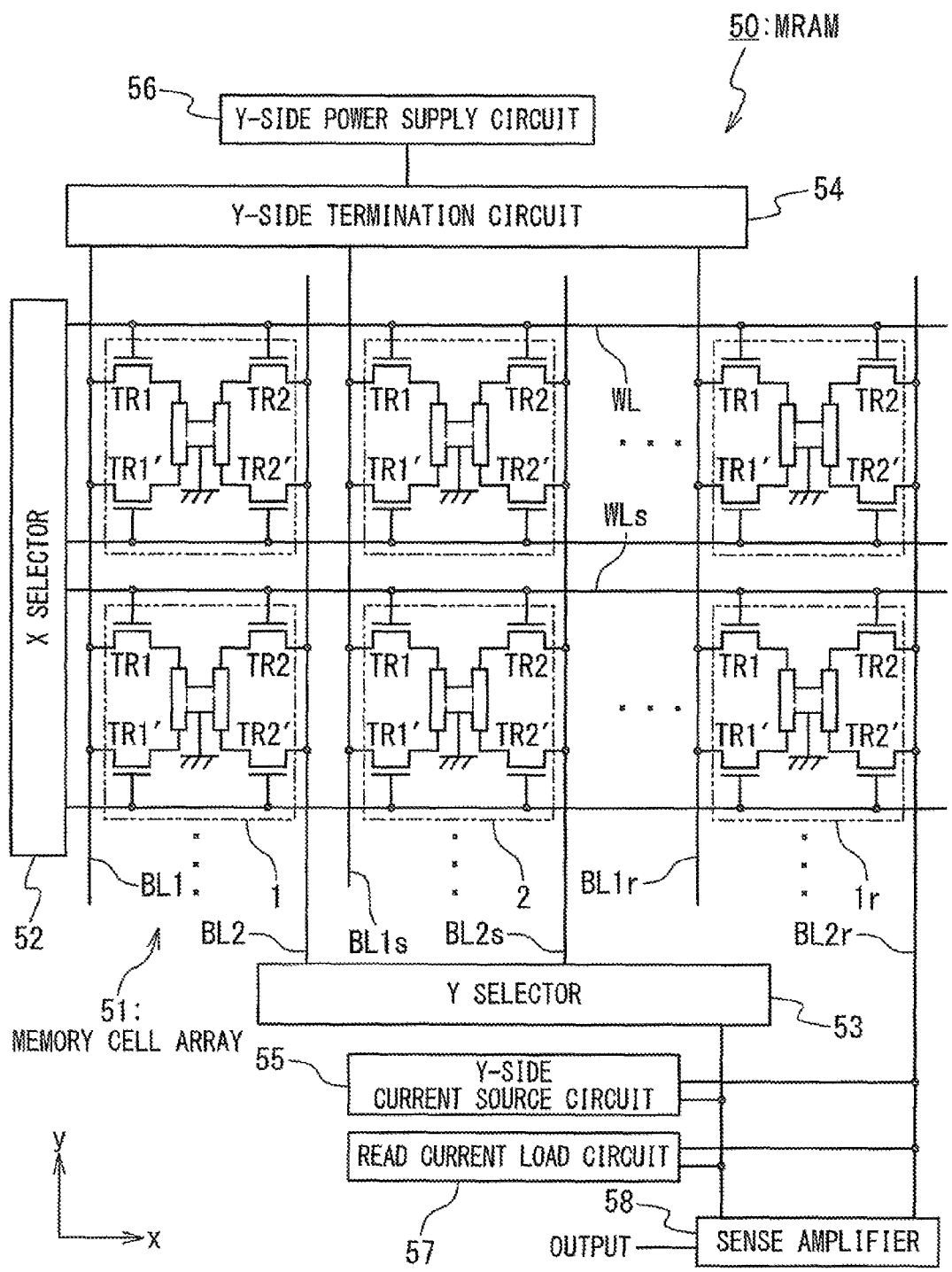
FIG. 19B is a circuit block diagram showing one example of the circuit configuration, corresponding to FIG. 18B, of the MRAM according to the first exemplary embodiment.

Each of FIG. 19A and FIG. 19B is a circuit block diagram showing one example of the configuration of its peripheral circuit. When the configuration of FIG. 18A is used as the magnetic memory cell 1, an MRAM is realized to have the peripheral circuit shown in FIG. 19A. When the configuration of FIG. 18B is used as the magnetic memory cell 1, the MRAM is realized to have the peripheral circuit shown in FIG. 19B. Since an operation method of the MRAM in FIG. 19A is similar to that of FIG. 11, its description is omitted. In the MRAM in FIG. 19B, the two word lines of a first word line WL1 and a second word line WL2 are provided. However, both of the first word line WL1 and the second word line WL2 are selected by the X selector 52 at the time of the write operation and at the time of the read operation. Thus, since the operation similar to the MRAM in FIG. 19A is carried out, its description is omitted.

According to the present invention, the above-mentioned effects are obtained at the same time. In order to attain the MRAM of the high integration, a high speed operation and a small power consumption amount, the technique according to the present invention is very useful.

2. SECOND EXEMPLARY EMBODIMENT

Figure 20A:
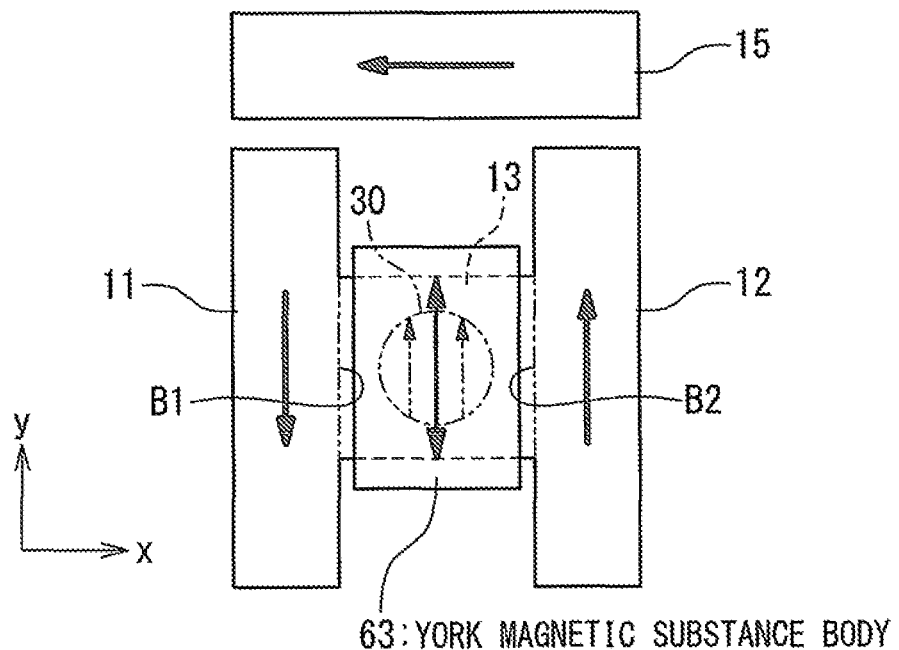
FIG. 20A is a plan view showing one example of a structure of a magnetic memory cell according to a second exemplary embodiment of the present invention.
Figure 20B:
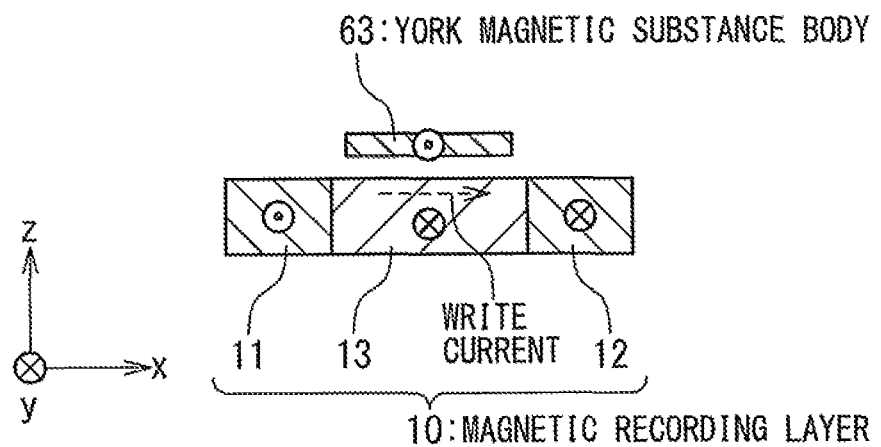
FIG. 20B is a side view showing one example of the structure of the magnetic memory cell according to the second exemplary embodiment of the present invention.

As the structure to improve the write efficiency of the magnetic recording layer 10, a method of using a yoke magnetic substance body is also considered. FIG. 20A is a plan view showing an example of the configuration in which the magnetic substance body (yoke magnetic substance body) is arranged near the magnetization inversion region 13, and FIG. 20B is a side view thereof. In FIG. 20A and FIG. 20B, for example, when the write current is supplied from the first magnetization fixed region 11 to the second magnetization fixed region 12, a yoke magnetic substance body 63 is magnetized to the −Y-direction by its write current. As a result, an induced magnetic field near the magnetization inversion region 13 that is generated by the yoke magnetic substance body 63 is oriented to the +Y-direction. On the other hand, the magnetization of the second magnetization fixed region 12 on the drawing-out side of the write current is also oriented to the +Y-direction. In short, since the magnetic field generated by the yoke magnetic substance body 63 coincides with the direction of the write magnetic field, the write can be efficiently performed. The yoke magnetic substance body 63 is provided on the side opposite to the pinned layer 30 with respect to the magnetization inversion region 13.

Figure 21A:
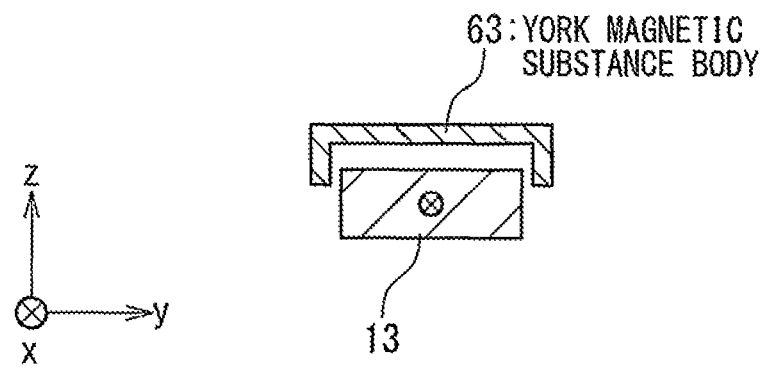
FIG. 21A is a plan view showing another example of the structure of the magnetic memory cell according to the second exemplary embodiment of the present invention.
Figure 21B:
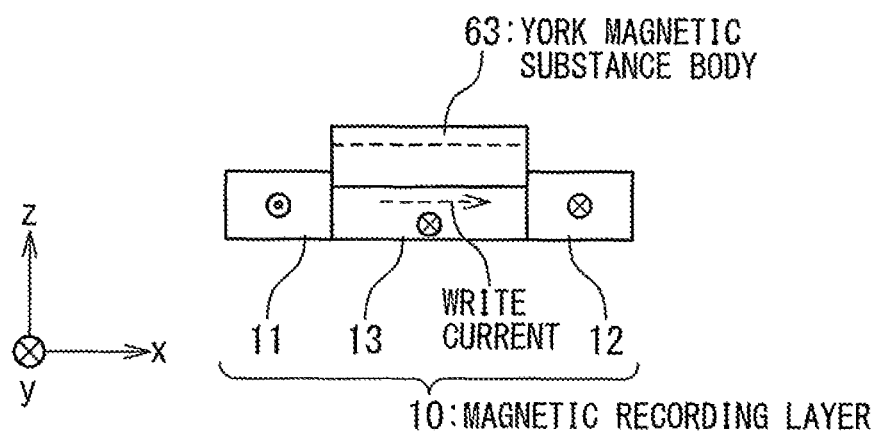
FIG. 21B is a side view showing another example of the structure of the magnetic memory cell according to the second exemplary embodiment of the present invention.

Devising a structure of the yoke magnetic substance body 63 can further increase the magnetic field efficiency applied to the magnetization inversion region 13. For example, FIG. 21A is a plan view showing another example of the configuration in which the magnetic substance body (yoke magnetic substance body) is arranged near the magnetization inversion region 13, and FIG. 21B is a side view thereof. In this case, the end of the yoke magnetic substance body 63 is protruded, thereby increasing the magnetic field that is applied to the magnetization inversion region 13.

As mentioned above, the structure of the magnetic memory cell in which the yoke magnetic substance body 63 is used is effective. However, when the orientations of the first magnetization fixed region 11 and the second magnetization fixed region 12 are made opposite, the effect resulting from the yoke magnetic substance 13 is made opposite. Thus, attention should be paid to this point in designing.

3. THIRD EXEMPLARY EMBODIMENT

Figure 22:
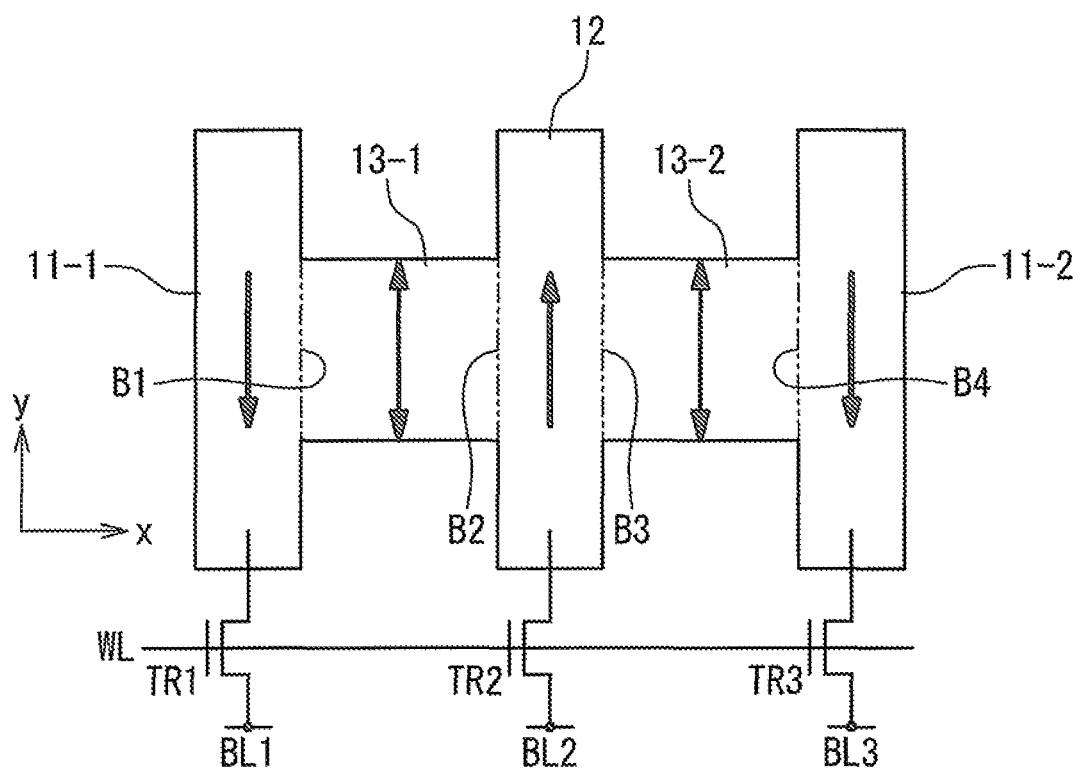
FIG. 22 is a plan view showing one example of a structure of a magnetic memory cell according to a third exemplary embodiment of the present invention.

FIG. 22 is a plan view showing still another example of the structure of the magnetic memory cell. In FIG. 22, the magnetic memory cell has a structure in which the memory cells of two bits are consecutive. The magnetic recording layer 10 includes a second magnetization inversion region 13-2 and a third magnetization fixed region 11-2, in addition to a first magnetization fixed region 11-1, a first magnetization inversion region 13-1 and a second magnetization fixed region 12. Each of the first magnetization inversion region 13-1 and the second magnetization inversion region 13-2 is connected through the tunnel barrier layer to the pinned layer (not shown).

The first magnetization fixed region 11-1 and the first magnetization inversion region 13-1 are connected to each other on the first boundary B1. The first magnetization inversion region 13-1 and the second magnetization fixed region 12 are connected to each other on the second boundary B2. The first boundary B1 and the second boundary B2 are located on the opposite ends of the first magnetization inversion region 13-1. Also, the second magnetization fixed region 12 and the second magnetization inversion region 13-2 are connected to each other on a third boundary B3. The second magnetization inversion region 13-2 and the third magnetization fixed region 11-2 are connected to each other on a fourth boundary B4. The third boundary 33 and the fourth boundary B4 are located on the opposite ends of the second magnetization inversion region 13-2.

In FIG. 22, the first magnetization fixed region 11-1, the second magnetization fixed region 12 and the third magnetization fixed region 11-2 are formed to be substantially parallel to each other along the Y-direction. The first magnetization inversion region 13-1 is formed along the X-direction for linkage between the first magnetization fixed region 11-1 and the second magnetization fixed region 12. The second magnetization inversion region 13-2 is formed along the X-direction for linkage between the second magnetization fixed region 12 and the third magnetization fixed region 11-2.

The magnetization orientations of the first magnetization inversion region 13-1 and the second magnetization inversion region 13-2 can be switched, and they are allowed to be oriented to the +Y-direction or the −Y-direction in accordance with the given magneto-crystalline anisotropy. The magnetization orientations of the first magnetization fixed region 11-1 and the third magnetization fixed region 11-2 are fixed to the −Y-direction. Also, the magnetization orientation of the second magnetization fixed region 12 is fixed to the +Y-direction. That is, the magnetization orientation of the first magnetization fixed region 11-1, the magnetization orientation of the second magnetization fixed region 12 and the magnetization orientation of the third magnetization fixed region 11-2 are alternately inverted along the shape of the magnetic recording layer 10.

In FIG. 22, the first magnetization fixed region 11-1 is connected through the first transistor TR1 to the first bit line BL1. The second magnetization fixed region 12 is connected through the second transistor TR2 to the second bit line BL2. The third magnetization fixed region 11-2 is connected through the third transistor TR3 to the third bit line BL3. For example, when a data is written to the first magnetization inversion region 13-1, the first transistor TR1 and the second transistor TR2 are turned ON, and the write current in a direction corresponding to the write data may be supplied to the first bit line BL1 and the second bit line BL2. Also, when a data is written to the second magnetization inversion region 13-2, the second transistor TR2 and the third transistor TR3 are turned ON, and the write current in a direction corresponding to the write data may be supplied to the second bit line BL2 and the third bit line BL3. The data read can be attained by, for example, a cross point method. Even by such a structure, the effect similar to the first exemplary embodiment is obtained.

The structure in which the memory cells of n bits (n is a natural number) are consecutive is represented as follows, when it is generalized. The magnetic recording layer includes n magnetization inversion regions A1 to An and (n+1) magnetization fixed regions B1 to Bn+1. The n magnetization inversion regions A1 to An and the (n+1) magnetization fixed regions B1 to Bn+1 are alternately arranged. In short, the $i^{th}$ (i is an integer between 1 and n) magnetization inversion region Ai is formed for linkage between the $i^{th}$ magnetization fixed region Bi and the $(i+1)^{th}$ magnetization fixed region Bi+1. The magnetization orientation of the $i^{th}$ magnetization fixed region Bi and the magnetization orientation of the $(i+1)^{th}$ magnetization fixed region Bi+1 are fixed to the directions opposite to each other. In short, the magnetization orientations of the (n+1) magnetization fixed regions B1 to B(n+1) are alternately inverted along the shape of the magnetic recording layer. Also, n MTJs are formed in the n magnetization inversion regions A1 to An, respectively. Moreover, the (n+1) magnetization fixed regions B1 to Bn+1 are connected through the (n+1) transistors to the (n+1) bit lines BL1 to BLn+1, respectively. When a data is written to the $i^{th}$ magnetization inversion region Ai, the write current in a direction corresponding to the write data is supplied to the $i^{th}$ bit line BLi and the $(i+1)^{th}$ bit line BLi+1. The data read can be attained by, for example, the cross point method. Even by such a structure, the effect similar to the first exemplary embodiment is obtained.

4. FOURTH EXEMPLARY EMBODIMENT

Figure 23:
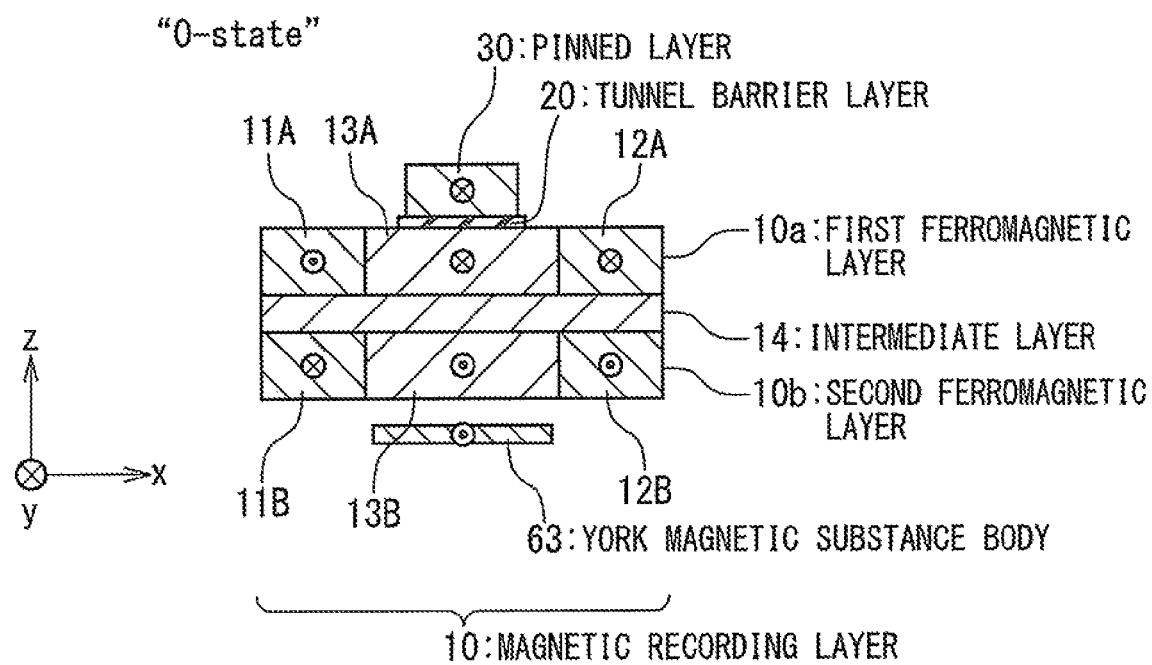
FIG. 23 is a section view showing one example of a structure of a magnetic memory cell according to a fourth exemplary embodiment of the present invention.

FIG. 23 is a side view showing the structure of the magnetic memory cell according to this exemplary embodiment. In this exemplary embodiment, the magnetic recording layer 10 is configured by a synthetic anti-ferromagnetic (SAF) layer. Specifically, the magnetic recording layer 10 includes a first ferromagnetic layer 10a and a second ferromagnetic layer 10b, which are anti-ferromagnetically coupled through an intermediate layer 14. The intermediate layer 14 is a non-magnetic layer, e.g., a Ru layer. The first ferromagnetic layer 10a has a first magnetization fixed region 11a, a second magnetization fixed region 12a and a magnetization fixed region 13a sandwiched between the first and second magnetization fixed regions 11a and 12a. Also, the second ferromagnetic layer 10b has a first magnetization fixed region 11b, a second magnetization fixed region 12b and a magnetization fixed region 13b sandwiched between the first and second magnetization fixed regions 11b and 12b.

The magnetization orientations of the first magnetization fixed regions 11a and 11b are opposite. Also, the magnetization orientations of the second magnetization fixed regions 12a and 12b are opposite. Also, the magnetization orientations of the magnetization inversion regions 13a and 13b are opposite. The magnetizations of the magnetization inversion regions 13a and 13b can be switched, and they are oriented to the +Y-direction or the −Y-direction. When one of the magnetizations of the magnetization inversion regions 13a and 13b is switched, the other magnetization is also switched. The magnetization inversion region 13a of the first ferromagnetic layer 10a is adjacent to the pinned layer 30 through the tunnel barrier layer 20. FIG. 23 shows "0-state" in which the magnetization of the magnetization inversion region 13a and the magnetization of the pinned layer 30 are parallel. In this case, the domain wall DW exists on the second boundary B2.

The data write is carried out similarly to the above-mentioned exemplary embodiments. For example, when the data "1" is written, the write currents flow from the second magnetization fixed regions 12a and 12b to the first magnetization fixed regions 11a and 11b inside the magnetic recording layer 10, respectively. As a result, the magnetizations of the magnetization inversion regions 13a and 13b are both switched, and the domain wall DW is moved to the second boundary B2. The data read is carried out by using the pinned layer 30 and sensing the magnetization orientation of the magnetization inversion region 13a in the first ferromagnetic layer 10a. Even by such a structure, the effect similar to the first exemplary embodiment is obtained. Moreover, the reduction of influence of an external magnetic field by the SAF layer is expected.

5. FIFTH EXEMPLARY EMBODIMENT

Figure 24:
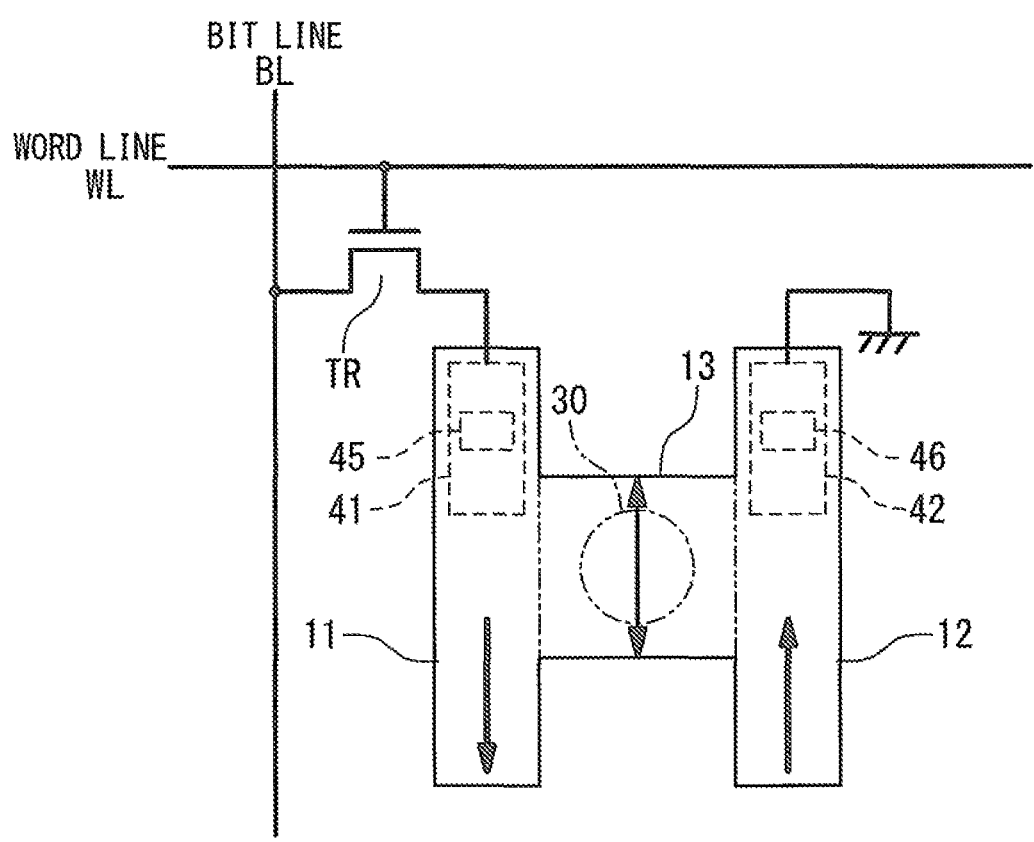
FIG. 24 is a plan view showing one example of a structure of a magnetic memory cell according to a fifth exemplary embodiment of the present invention.
Figure 25:
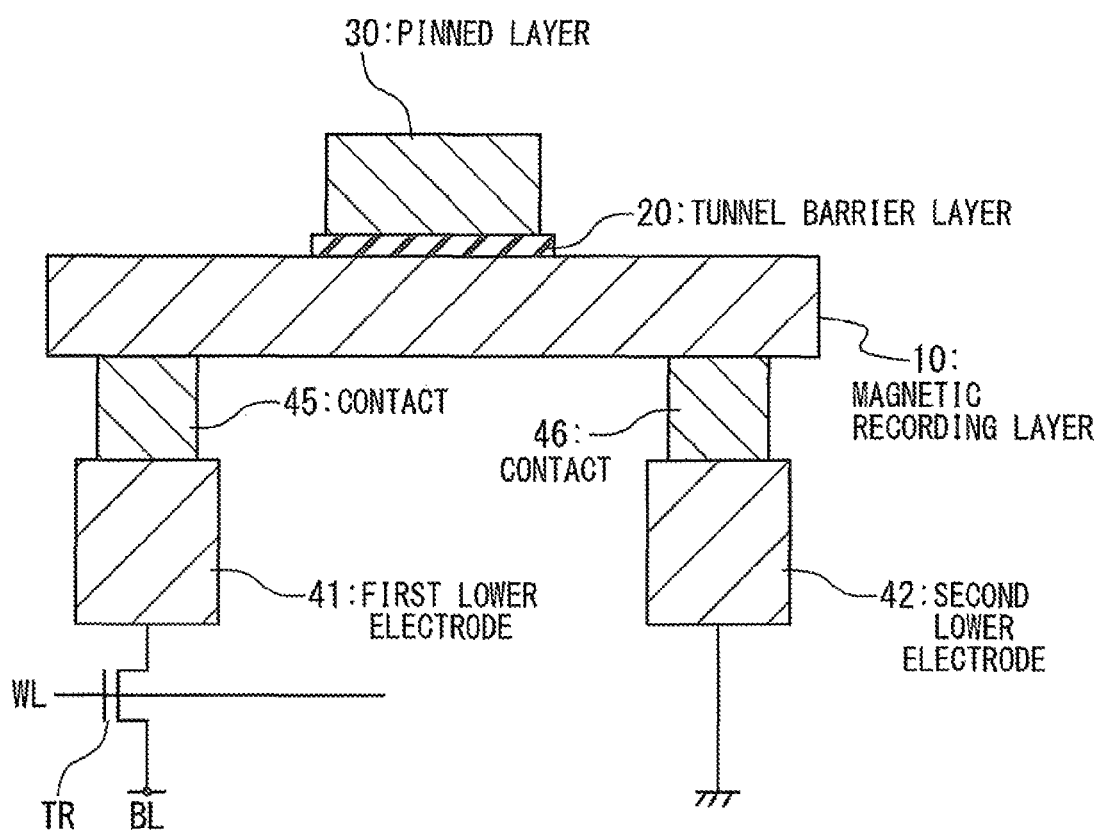
FIG. 25 is a sectional view showing one example of the structure of the magnetic memory cell according to the fifth exemplary embodiment of the present invention.

Although FIG. 8 shows the circuit configuration of the magnetic memory cell having the two transistors TR1 and TR2, the circuit configuration is not limited thereto. FIG. 24 is a plan view showing the circuit configuration of the magnetic memory cell that has only one transistor TR. Also, FIG. 25 is a sectional view schematically showing the structure of the magnetic memory cell shown in FIG. 24.

The first magnetization fixed region 11 in the magnetic recording layer 10 is connected through a contact 45 to a first lower electrode 41, and the second magnetization fixed region 12 is connected through a contact 46 to a second lower electrode 42. The first lower electrode 41 is connected to one of the source/drain of the transistor TR. The other of the source/drain of the transistor TR is connected to the bit line BL. Also, the second lower electrode 42 is connected to the ground. The gate of the transistor TR is connected to the word line WL.

When a data is written, the word line WL connected to a target memory cell is selected, and the transistor TR connected to the target memory cell is turned on. The direction of the write current flowing through the bit line BL is changed in accordance with the write data. For example, when the data "1" is written, a write current supplying circuit supplies the first write current $IW_1$ to the bit line BL. In this case, the first write current $IW_1$ flows from the bit line BL through the transistor TR, the first magnetization fixed region 11, the magnetization inversion region 13 and the second magnetization fixed region 12 to the ground. On the other hand, when the data "0" is written, the write circuit supplying circuit draws out the second write current $IW_2$ from the ground. In this case, the second write current $IW_2$ flows from the ground through the second magnetization fixed region 12, the magnetization inversion region 13, the first magnetization fixed region 11 and the transistor TR to the bit line BL. The data read can be attained by, for example, the cross point method. Even by such a structure, the effect similar to the first exemplary embodiment is obtained.

6. SIXTH EXEMPLARY EMBODIMENT

Figure 26:
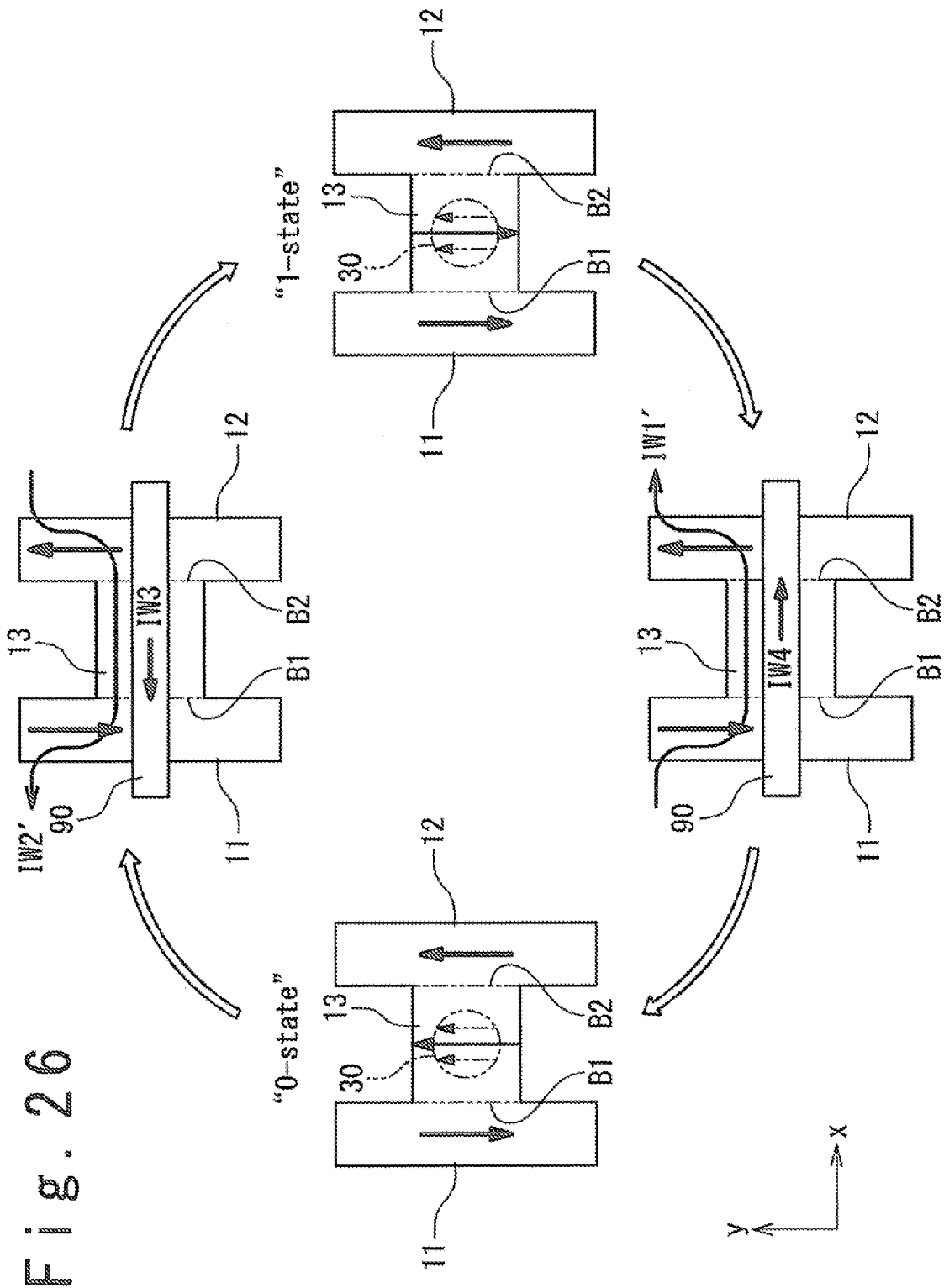
FIG. 26 is a plan view showing the principle of the data write to a magnetic memory cell according to a sixth exemplary embodiment of the present invention.

The data can be also written to the magnetic memory cell 1 in the above-mentioned exemplary embodiments by auxiliarly applying the write magnetic field from the outside. FIG. 26 is a plan view showing the principle of applying the write magnetic field from the outside and writing the data to the magnetic memory cell. In this case, the MRAM contains a write interconnection 90 that is magnetically coupled to the magnetic recording layer 10 (magnetization inversion region 13). The other components are similar to the case of FIG. 7.

When the data "1" is written, similarly to the case of FIG. 7, a second write current $I_{W2}'$ (whose current value is smaller than the second write current in FIG. 7) is supplied to the magnetic recording layer 10 in the −X-direction. Simultaneously, a third write current is supplied to the write interconnection 90 in the −X-direction. The write magnetic field generated by the third write current $I_{W2}$ is applied to the magnetization inversion region 13. The direction of the write magnetic field is the −Y-direction at the position of the magnetization inversion region 13. As a result, the magnetization of the magnetization inversion region 13 is switched, and the domain wall DW is moved from the first boundary B1 to the second boundary B2. Thus, the data "1" is written.

On the other hand, when the data "0" is written, similarly to the case of FIG. 7, a first write current (whose current value is smaller than the first write current $I_{W1}$ in FIG. 7) is supplied to the magnetic recording layer 10 in the +X-direction. Simultaneously, a fourth write current $I_{W4}$ is supplied to the write interconnection 90 in the +X-direction. The write magnetic field generated by the fourth write current $I_{W4}$ is applied to the magnetization inversion region 13. The orientation of the write magnetic field is the +Y-direction at the position of the magnetization inversion region 13. As a result, the magnetization of the magnetization inversion region 13 is switched, and the domain wall DW is moved from the second boundary B2 to the first boundary B1. Thus, the data "0" is written.

In this case, the value of the write current directly flowing through the magnetic recording layer 10 can be decreased, as compared with the case of FIG. 7. Also, as compared with the case in which the magnetization switching is carried out only on the write interconnection 90, the current flowing through the write interconnection 90 can be decreased. With those mechanisms, the maximum current of each of elements related to a current source can be suppressed to a small value.

Figure 27:
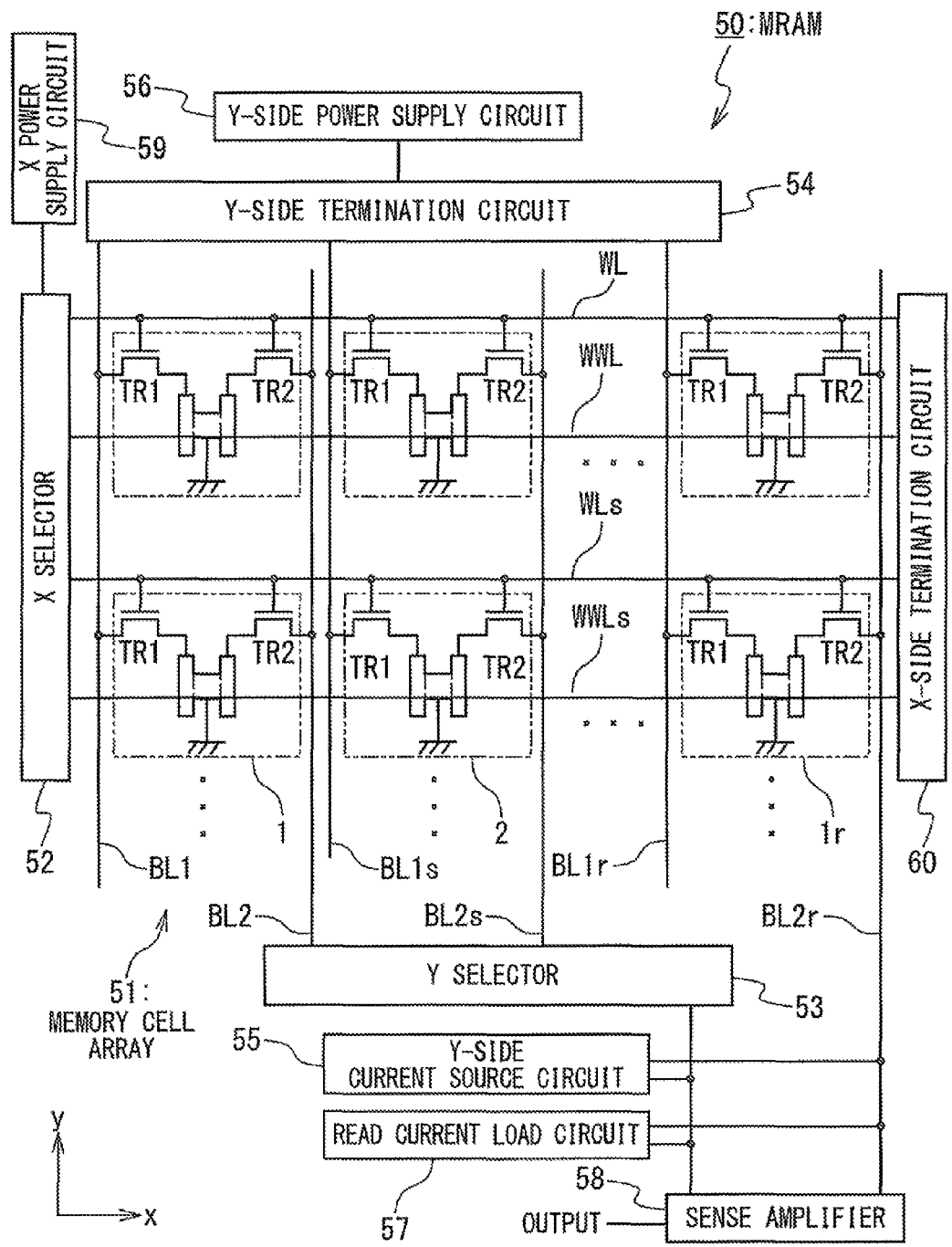
FIG. 27 is a circuit block diagram showing one example of a circuit configuration of the MRAM according to the sixth exemplary embodiment.

The peripheral circuit for controlling the word line WL, a write word line WWL (the write interconnection 90 in FIG. 26), the first bit line BL1 and the second bit line BL2 may be properly designed by one skilled in the art. FIG. 27 is a circuit block diagram showing one example of the configuration of the peripheral circuit. Here, in addition to the circuit in FIG. 11, an X power supply circuit 59 for supplying the write current through the X selector 52 to the write word line WWL and an X-side termination circuit 60 for terminating the write word line WWL at the time of the write operation are added.

In the write operation, as well as the operation of the circuit in FIG. 11, the X selector 52 selects the write word line WWL (write interconnection 90) on a selection cell, and the X power supply circuit 59 supplies the write current (third write current $I_{W1}$, or fourth write current $I_{W4}$) in a direction corresponding to the write data.

It should be noted that the above-mentioned first to sixth exemplary embodiments can be properly combined unless any technical contradiction is not generated.

The present invention is not limited to the above-mentioned exemplary embodiments, and it is evident that variations and modifications without departing from the scope and spirit of the present invention can be carried out.

According to the present invention, a new data write method with regard to the MRAM is provided. Specifically, the write current does not flow in the direction penetrating the MTJ, and it flatly and planarly flows inside the magnetic recording layer. Through the spin transfer effect caused by the spin electrons, the magnetization of the magnetization inversion region inside the magnetic recording layer is switched to the orientation according to the direction of the write current. At this time, the domain wall inside the magnetic recording layer is reciprocated in the manner of "Seesaw" between the first boundary and the second boundary according to the motion direction of the electrons serving as the write current. In short, the domain wall is moved inside the magnetization inversion region (Domain Wall Motion).

At the time of write, since the write current does not penetrate the MTJ, the deterioration of the tunnel barrier layer in the MTJ is suppressed. Also, the data write is carried out by the spin transfer method. Thus, the write current is decreased in association with the contraction of the memory cell size. Moreover, as the memory cell size is contracted, the motion distance of the domain wall is made shorter. Therefore, the write speed is increased in association with the finer structure of the memory cell.

The invention claimed is:

1. A magnetic memory cell comprising:
   a magnetic recording layer which is a ferromagnetism layer; and
   a pinned layer connected with said magnetic recording layer through a non-magnetic layer,
   wherein said magnetic recording layer comprises:
   a magnetization inversion region having a magnetization invertible into a first direction or a second direction and provided to overlap said pinned layer;
   a first magnetization fixed region connected with a first boundary of said magnetization inversion region and having a magnetization whose orientation is fixed on the first direction; and
   a second magnetization fixed region connected with a second boundary of said magnetization inversion region and having a magnetization whose orientation is fixed on the second direction, and
   the first direction and the second direction are opposite to each other,
   wherein said magnetization inversion region, said first magnetization fixed region and said second magnetization fixed region are provided in a same layer,
   wherein said magnetization inversion region, said first magnetization fixed region and said second magnetization fixed region are arranged in an H-shaped form.

2. The magnetic memory cell according to claim 1, wherein one of the first direction and the second direction is coincident with an orientation of a magnetization of said pinned layer.

3. The magnetic memory cell according to claim 1, further comprising:
   a first magnetic substance body configured to apply a bias magnetic field of the first direction to said first magnetization fixed region; and
   a second magnetic substance body configured to apply a bias magnetic field of the second direction to said second magnetization fixed region.

4. The magnetic memory cell according to claim 3, wherein said first magnetic substance body and said second magnetic substance body are provided to be in contact with said first magnetization fixed region and said second magnetization fixed region, respectively, and
   an orientation of a magnetization of said first magnetic substance body is the first direction and an orientation of a magnetization of said second magnetic substance body is the second direction.

5. The magnetic memory cell according to claim 3, wherein said first magnetic substance body and said second magnetic substance body are provided to be away said first magnetization fixed region and said second magnetization fixed region, respectively, and an orientation of a magnetization of said first magnetic substance body is opposite to the first direction, and an orientation of a magnetization of said second magnetic substance body is opposite to the second direction.

6. The magnetic memory cell according to claim 1, wherein said first magnetization fixed region and said second magnetization fixed region have magnetic anisotropy of a same orientation, and said magnetization inversion region has magnetic anisotropy of a same orientation as one of the magnetization orientations of said first magnetization fixed region and said second magnetization fixed region.

7. The magnetic memory cell according to claim 6, wherein an external magnetic field is applied in a same direction of as one of the first direction and the second direction.

8. The magnetic memory cell according to claim 1, wherein a first write current flows from said first magnetization fixed region to said second magnetization fixed region through said magnetization inversion region in case of a first write operation, and a second write current flows from said second magnetization fixed region to said first magnetization fixed region through said magnetization inversion region in case of a second write operation.

9. The magnetic memory cell according to claim 8, wherein a domain wall is positioned in said first boundary in said magnetic recording layer through the first write operation, and the domain wall is positioned in said second boundary in said magnetic recording layer through the second write operation.

10. The magnetic memory cell according to claim 8, wherein the first direction is coincident with a magnetization orientation of said pinned layer, the magnetization orientation of said magnetization inversion region is turned to the second direction through the first write operation, and the magnetization orientation of said magnetization inversion region is turned to the first direction through the second write operation.

11. The magnetic memory cell according to claim 1, wherein a read current flows between one of said first magnetization fixed region and said second magnetization fixed region and said pinned layer through said magnetization inversion region and said non-magnetic layer in case of a read operation.

12. The magnetic memory cell according to claim 1, further comprising:

a first auxiliary magnetic substance body static-coupled with said first magnetization fixed region and said second magnetization fixed region.

13. The magnetic memory cell according to claim 1, wherein said first magnetization fixed region is static-coupled with said second magnetization fixed region.

14. A magnetic random access memory comprising:
a magnetic memory cell;
a bit line connected with said magnetic memory cell; and
a word line connected with said magnetic memory cell,
wherein said magnetic memory cell comprises:
a magnetic recording layer which is a ferromagnetism layer; and a pinned layer connected with said magnetic recording layer through a non-magnetic layer,
wherein said magnetic recording layer comprises:
a magnetization inversion region having a magnetization invertible into a first direction or a second direction and provided to overlap said pinned layer;
a first magnetization fixed region connected with a first boundary of said magnetization inversion region and having a magnetization whose orientation is fixed on the first direction; and
a second magnetization fixed region connected with a second boundary of said magnetization inversion region and having a magnetization whose orientation is fixed on the second direction, and
the first direction and the second direction are opposite to each other,
wherein said bit line comprises:
a first bit line connected with said first magnetization fixed region through a first transistor,
said magnetic random access memory further comprises:
a write current supplying circuit connected with said first bit line and configured to control a current flowing through said magnetic memory cell based on a write data,
wherein said magnetization inversion region, said first magnetization fixed region and said second magnetization fixed region are provided in a same layer,
wherein said magnetization inversion region, said first magnetization fixed region and said second magnetization fixed region are arranged in an H-shaped form.

15. The magnetic random access memory according to claim 14, wherein said bit line further comprises:
a second bit line connected with said second magnetization fixed region through a second transistor,
wherein said word line is connected with gates of said first and second transistors,
said write current supplying circuit is connected with said first bit line and said second bit line,
in case of a first write operation, said word line is selected, and said write current supplying circuit supplies a first write current from said first bit line to said second bit line through said first transistor, said magnetic recording layer and said second transistor, and
in case of a second write operation, said word line is selected, and said write current supplying circuit supplies a second write current from said second bit line to said first bit line through said second transistor, said magnetic recording layer and said first transistor.

16. The magnetic random access memory according to claim 14,
wherein said first bit line is connected with said first magnetization fixed region through said first transistor and a third transistor, and
said bit line further comprises:
a second bit line connected with said second magnetization fixed region through a second transistor and a fourth transistor,
wherein said word line comprises:
a first word line connected to gates of said first and second transistors; and
a second word line connected to gates of said third and fourth transistors,
said write current supplying circuit is connected with said first bit line and said second bit line,
in case of a first write operation, said first and second word lines are selected, and said write current supplying circuit supplies a first write current from said first bit line to said second bit line through said first transistor and said third transistor, said magnetic recording layer, and said second transistor and a said fourth transistor, and in case of a second write operation, said first and second word lines are selected, and said write current supplying circuit supplies a second write current from said second bit line to said first bit line through said second transistor and said fourth transistor, said magnetic recording layer, and said first transistor and said third transistor.

17. The magnetic random access memory according to claim 14, wherein said bit line further comprises:

a second bit line connected with said second magnetization fixed region through a second transistor, wherein said word line is connected with gates of said first and second transistors, said first magnetization fixed region and said first transistor are connected through a plurality of interconnections, said second magnetization fixed region and said second transistor are connected through a plurality of interconnections, said write current supply circuit is connected with said first bit line and said second bit line, in case of a first write operation, said word line is selected, and said write current supplying circuit supplies a first write current from said first bit line to said second bit line through said first transistor, said first auxiliary interconnection, said magnetic recording layer and said second transistor, and in case of a second write operation, said word line is selected, and said write current supplying circuit supplies a second write current from said second bit line to said first bit line through said second transistor, said second auxiliary interconnection, said magnetic recording layer and said first transistor.

18. The magnetic random access memory according to claim 14, where said word line is connected with a gate of said first transistor, said write current supplying circuit is connected with said first bit line, said second magnetization fixed region of said magnetic memory cell is grounded, in case of a first write operation, said word line is selected, and said write current supplying circuit supplies the first write current from said bit line to said magnetic memory cell through said transistor, and in case of a second write operation, said word line is selected, and said write current supplying circuit draws out the second write current from said magnetic memory cell through said transistor and said bit line.

19. An operation method of a magnetic random access memory, wherein said magnetic random access memory comprises a magnetic memory cell, said magnetic memory cell comprises a magnetic recording layer which is a ferromagnetic layer, and a pinned layer connected with said magnetic recording layer through a non-magnetic layer, said magnetic recording layer comprises a magnetization inversion region having a magnetization invertible in a first direction and a second direction, and provided to overlap said pinned layer, a first magnetization fixed region connected with a first boundary of said magnetization inversion region and having a magnetization whose orientation is fixed to the first direction, and a second magnetization fixed region connected with a second boundary of said magnetization inversion region and having a magnetization whose orientation is fixed to a second direction, and the first direction is parallel or anti-parallel to the magnetization orientation of said pinned layer, said operation method comprising:

making a first write current flow from said first magnetization fixed region to said second magnetization fixed region through said magnetization inversion region in case of writing a first data; and making a second write current flow from said second magnetization fixed region to said first magnetization fixed region through said magnetization inversion region in case of writing a second data, wherein said magnetization inversion region, said first magnetization fixed region and said second magnetization fixed region are provided in a same layer, wherein said magnetization inversion region, said first magnetization fixed region and said second magnetization fixed region are arranged in an H-shaped form.

20. The operation method according to claim 19, further comprising:

making a read current flow between one of said first magnetization fixed region and said second magnetization fixed region and said pinned layer through said magnetization inversion region and said non-magnetic layer, when reading said first data or said second data stored in said magnetic memory cell.

* * * * *